(12) United States Patent
Kokawa et al.

(10) Patent No.: US 8,067,787 B2
(45) Date of Patent: Nov. 29, 2011

(54) SEMICONDUCTOR ELECTRONIC DEVICE

(75) Inventors: Takuya Kokawa, Tokyo (JP); Sadahiro Kato, Tokyo (JP); Yoshihiro Sato, Tokyo (JP); Masayuki Iwami, Tokyo (JP)

(73) Assignee: The Furukawa Electric Co., Ltd, Tokyo (JP)

( * ) Notice: Subject to any disclaimer, the term of this patent is extended or adjusted under 35 U.S.C. 154(b) by 478 days.

(21) Appl. No.: 12/364,966

(22) Filed: Feb. 3, 2009

(65) Prior Publication Data

US 2009/0200645 A1 Aug. 13, 2009

(30) Foreign Application Priority Data

Feb. 7, 2008 (JP) .................................. 2008-027765
May 29, 2008 (JP) .................................. 2008-140649

(51) Int. Cl.
*H01L 21/02* (2006.01)

(52) U.S. Cl. ............... 257/190; 257/12; 257/13; 257/14; 257/94; 257/96; 257/103; 257/191; 257/192; 257/193; 257/194; 438/46; 438/47; 438/172

(58) Field of Classification Search ............... 257/12–14, 257/94, 96, 103, 190–194; 438/46–47, 172
See application file for complete search history.

(56) References Cited

U.S. PATENT DOCUMENTS

| | | | | |
|---|---|---|---|---|
| 5,847,409 | A * | 12/1998 | Nakayama | 257/15 |
| 7,518,154 | B2 * | 4/2009 | Otsuka et al. | 257/96 |
| 7,569,870 | B2 * | 8/2009 | Yanagihara et al. | 257/192 |
| 7,745,850 | B2 * | 6/2010 | Otsuka et al. | 257/194 |
| 2005/0118752 | A1 * | 6/2005 | Otsuka et al. | 438/172 |
| 2006/0054926 | A1 * | 3/2006 | Lahreche | 257/194 |

FOREIGN PATENT DOCUMENTS

| | | |
|---|---|---|
| JP | 2003-059948 | 2/2003 |
| JP | 2007-088426 | 4/2004 |

\* cited by examiner

*Primary Examiner* — Kevin M Picardat
*Assistant Examiner* — Bac Au
(74) *Attorney, Agent, or Firm* — Turocy & Watson, LLP

(57) ABSTRACT

A semiconductor electronic device comprises a substrate; a buffer layer formed on the substrate, the buffer layer including not less than two layers of composite layer in which a first semiconductor layer formed of a nitride-based compound semiconductor layer having a lattice constant smaller than a lattice constant of the substrate and a thermal expansion coefficient larger than a thermal expansion coefficient of the substrate and a second semiconductor layer formed of a nitride-based compound semiconductor having a lattice constant smaller than a lattice constant of the first semiconductor layer and a thermal expansion coefficient larger than a thermal expansion coefficient of the substrate are alternately laminated; an intermediate layer provided between the substrate and the buffer layer, the intermediate layer being formed of a nitride-based compound semiconductor having a lattice constant smaller than a lattice constant of the first semiconductor layer and a thermal expansion coefficient larger than a thermal expansion coefficient of the substrate; and a semiconductor active layer formed on the buffer layer, the semiconductor active layer being formed of a nitride-based compound semiconductor, wherein: thicknesses of the first semiconductor layers in the buffer layer are non-uniform thereamong, and at least one of the first semiconductor layer has a thickness greater than a critical thickness, the critical thickness being a thickness above which a direction of warp caused by the first semiconductor layer to the substrate is inverted.

14 Claims, 30 Drawing Sheets

US 8,067,787 B2

SEMICONDUCTOR ELECTRONIC DEVICE

CROSS-REFERENCE TO RELATED APPLICATIONS

This application claims priority from Japanese patent application No. 2008-027765 filed on Feb. 7, 2008, and Japanese patent application No. 2008-140649 filed on May 29, 2008, the entire content of which are incorporated herein by reference.

BACKGROUND OF THE INVENTION

1. Field of the Invention

The present invention relates to a semiconductor electronic device made of a nitride-based compound semiconductor.

2. Description of the Related Art

The electronic devices such as the field effect transistor or the like using a nitride based compound semiconductor expressed by a formula $Al_xIn_yGa_{1-x-y}As_uP_vN_{1-u-v}$ (where $0 \leq x \leq 1$, $0 \leq y \leq 1$, $x+y \leq 1$, $0 \leq u \leq 1$, $0 \leq v \leq 1$, $u+v<1$), such as a GAN-based compound semiconductor, has attracted a significant attention as a solid state device capable of operating in a high temperature environment close to 400° C. Unlike Si or GaAs, it is difficult to manufacture a large diameter single crystal substrate of GaN-based compound semiconductor. Therefore, the electronic device using a GaN-based compound semiconductor is fabricated on a substrate formed of silicon carbide (SiC), sapphire, ZnO or Si. Especially, Si substrate is very useful because a large diameter wafer is available at a low price.

However, there are large differences in lattice constant and thermal expansion coefficient between Si and GaN. Therefore, when a GaN layer is grown directly on a Si substrate, a large tensile strain is created in the GaN layer, which is a cause of a concave warp of the epitaxial wafer and/or a degradation of a crystal quality. Further, when the immanent strain is too large, cracks are generated in the GaN layer. Therefore, a buffer layer is normally provided between the Si substrate and the GaN layer as a strain relaxing layer. A lamination structure constituted by GaN layers and AlN layers is effective as the buffer layer (see Patent Reference 1 and 2).

A manufacturing method of a GaN-based field effect transistor described in the Patent Reference 1 is as follows. First, an AlN layer is formed on a single crystal Si substrate of 4 inches (101.6 mm) in diameter using an epitaxial crystal growth method such as MOCVD method at a substrate temperature of about 1000 to 1100° C. Then, a buffer layer is formed by growing composite layers in which a GaN layer and an AlN layer are laminated at the same temperature. Thereafter, an electron drift layer, an electron supplying layer and a contact layer are sequentially grown on the buffer layer to form a semiconductor active layer, and a source electrode, a drain electrode, and a gate electrode are formed. Then, the wafer is separated into each device. In this way, by forming the buffer layer constituted by composite layers of GaN layer and AlN layer, it is possible to epitaxially grow a GaN layer with no crack included and of superior crystal quality on the Si substrate. Further, a warp of the epitaxial wafer can be reduced. Note that the buffer layer is not limited to the composite layers of GaN layer and AlN layer, but may be composite layers of AlGaN layers having different compositions each other and appropriate amount of strain therebetween.

Patent Reference 1 Japanese patent publication No. 2003-59948

Patent Reference 2 Japanese patent publication No. 2007-88426

In order to realize an electric power source device employing an electronic device that includes epitaxial layers of a GaN-based compound semiconductor, it is important to increase a breakdown voltage of the electronic device. A Si substrate has relatively a low resistance as compared with a sapphire substrate, for example. Accordingly, in order to increase a breakdown voltage of the electronic devices using a Si substrate, it is necessary to increase a total layer thickness of the epitaxial layers formed on the Si substrate. However, when increasing the total layer thickness of the epitaxial layers, an amount of strain included also increases. Therefore, in order to prevent an adverse effect of the strain, it is necessary to increase the number of composite layers of the buffer layer according to the increase in the total layer thickness of the epitaxial layer.

However, the increase in the number of composite layers will cause convex warp of the epitaxial wafer to a large degree. Therefore, it is difficult to increase a breakdown voltage while restraining the warp of the epitaxial wafer.

SUMMARY OF THE INVENTION

It is an object of the present invention to provide a semiconductor electronic device having a large breakdown voltage and reduced warp.

According to an aspect of the present invention, there is provided a semiconductor electronic device comprising: a substrate; a buffer layer formed on the substrate, the buffer layer including not less than two layers of composite layer in which a first semiconductor layer formed of a nitride-based compound semiconductor layer having a lattice constant smaller than a lattice constant of the substrate and a thermal expansion coefficient larger than a thermal expansion coefficient of the substrate and a second semiconductor layer formed of a nitride-based compound semiconductor having a lattice constant smaller than a lattice constant of the first semiconductor layer and a thermal expansion coefficient larger than a thermal expansion coefficient of the substrate are alternately laminated; an intermediate layer provided between the substrate and the buffer layer, the intermediate layer being formed of a nitride-based compound semiconductor having a lattice constant smaller than a lattice constant of the first semiconductor layer and a thermal expansion coefficient larger than a thermal expansion coefficient of the substrate; and a semiconductor active layer formed on the buffer layer, the semiconductor active layer being formed of a nitride-based compound semiconductor, wherein: thicknesses of the first semiconductor layers in the buffer layer are non-uniform thereamong, and at least one of the first semiconductor layer has a thickness greater than a critical thickness, the critical thickness being a thickness above which a direction of warp caused by the first semiconductor layer to the substrate is inverted.

According to another aspect of the present invention, there is provided a semiconductor electronic device comprising: a substrate; a buffer layer formed on the substrate, the buffer layer including not less than two layers of composite layer in which a first semiconductor layer formed of a nitride-based compound semiconductor layer having a lattice constant smaller than a lattice constant of the substrate and a thermal expansion coefficient larger than a thermal expansion coefficient of the substrate and a second semiconductor layer formed of a nitride-based compound semiconductor having a lattice constant smaller than a lattice constant of the first semiconductor layer and a thermal expansion coefficient larger than a thermal expansion coefficient of the substrate are alternately laminated; an intermediate layer provided between the substrate and the buffer layer, the intermediate layer being formed of a nitride-based compound semiconductor having a lattice constant smaller than a lattice constant of the first semiconductor layer and a thermal expansion coefficient larger than a thermal expansion coefficient of the substrate; and a semiconductor active layer formed on the buffer layer, the semiconductor active layer being formed of a nitride-based compound semiconductor, wherein the buffer layer is formed such that the thickness of the second semiconductor layers decreases in a direction of lamination.

According to still another aspect of the present invention, there is provided a semiconductor electronic device comprising: a substrate; a buffer layer formed on the substrate, the buffer layer including not less than two layers of composite layer in which a first semiconductor layer formed of a nitride-based compound semiconductor layer having a lattice constant smaller than a lattice constant of the substrate and a thermal expansion coefficient larger than a thermal expansion coefficient of the substrate and a second semiconductor layer formed of a nitride-based compound semiconductor having a lattice constant smaller than a lattice constant of the first semiconductor layer and a thermal expansion coefficient larger than a thermal expansion coefficient of the substrate are alternately laminated; an intermediate layer provided between the substrate and the buffer layer, the intermediate layer being formed of a nitride-based compound semiconductor having a lattice constant smaller than a lattice constant of the first semiconductor layer and a thermal expansion coefficient larger than a thermal expansion coefficient of the substrate; and a semiconductor active layer formed on the buffer layer, the semiconductor active layer being formed of a nitride-based compound semiconductor, wherein the buffer layer is formed such that the lattice constant of the second semiconductor layers increases in a direction of lamination.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Semiconductor electronic devices according to preferred embodiments of the present invention will be explained in detail below with reference to the drawings. The present invention is not limited by these embodiments.

First Embodiment

Figure 1:
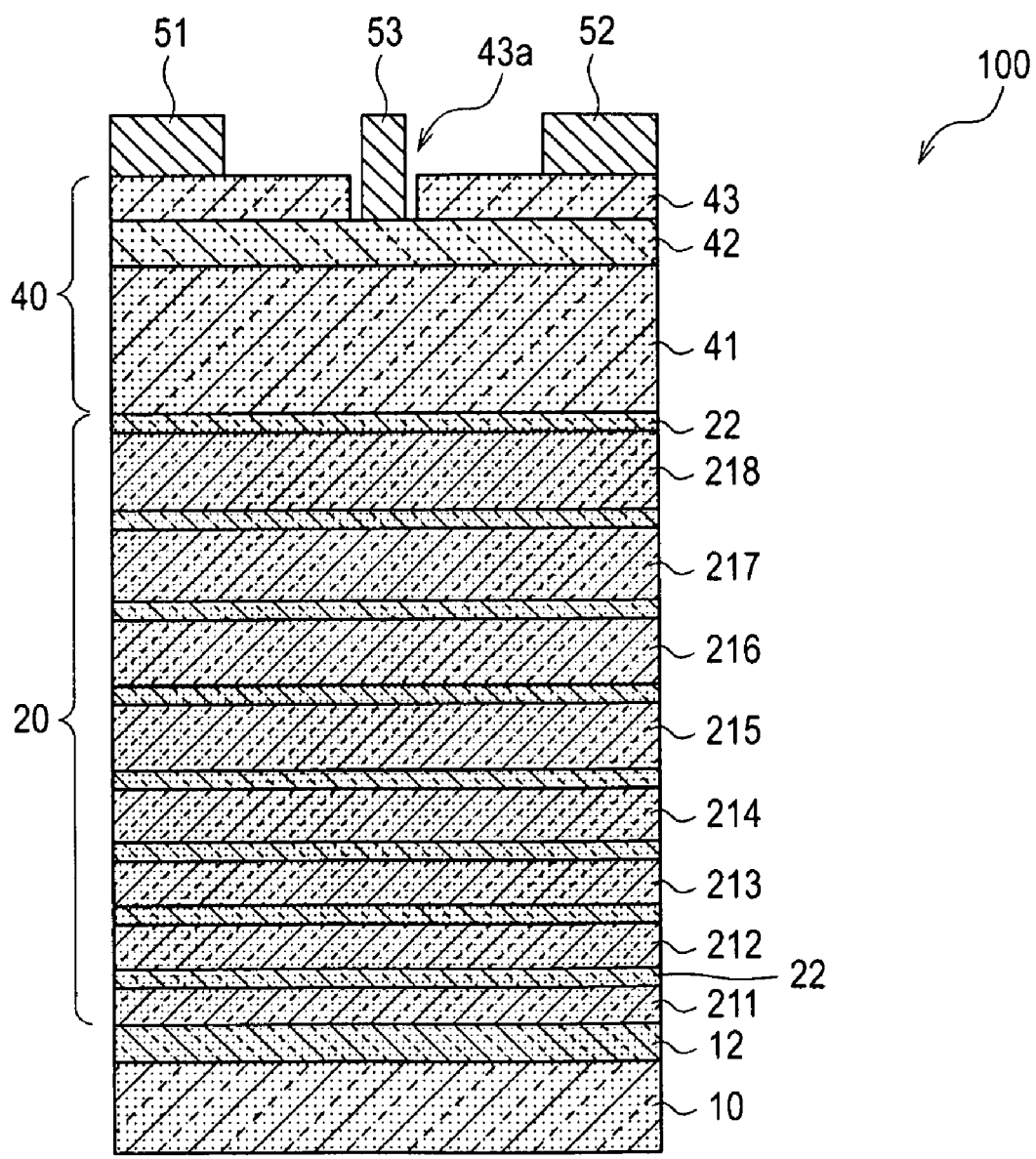
FIG. 1 is a cross sectional view schematically showing a field effect transistor according to a first embodiment of the present invention.

FIG. 1 is a cross sectional view schematically showing a field effect transistor according to a first embodiment of the present invention. The field effect transistor 100 is a high electron mobility transistor (HEMT), and includes a substrate 10 of single crystal Si having a (111) face as a principal face, a buffer layer 20 formed on the substrate 10, an intermediate layer 12 formed between the substrate 10 and the buffer layer 20, a semiconductor active layer 40 formed on the buffer layer 20, and a source electrode 51, a drain electrode 52 and a gate electrode 53 which are formed on the semiconductor active layer 40.

The intermediate layer 12 is formed of undoped AlN. The semiconductor active layer 40 is a layered structure in which an electron drift layer 41 formed of undoped GaN, an electron supplying layer 42 of Si-doped n-type AlGaN, and a contact layer 43 formed of n+-type GaN are sequentially formed in this order. Both the source electrode 51 and the drain electrode 52 have a layered structure of Ti/Al, and are formed on the contact layer 43. Further, the gate electrode 53 has a layered structure of Pt/Au, and is formed on the electron supplying layer 42 through an opening 43a formed in the contact layer 43.

The buffer layer 20 is a layered structure in which first semiconductor layers 211, ..., 218 formed of undoped GaN and second semiconductor layers 22, ..., 22 formed of undoped AlN are alternately formed. A pair of a first semiconductor layer and a neighboring second semiconductor layer being considered as one composite layer, the buffer layer 20 has eight composite layers. Note that if the first semiconductor layer 211 of GaN is directly formed on the substrate 10 of Si, Ga and Si forms an alloy. Because of the presence of the intermediate layer 12, the formation of alloy is prevented.

The Si substrate 10 has a lattice constant of 0.384 nm and a thermal expansion coefficient of $3.59 \times 10^{-6}$/K. The first semiconductor layers 211, ..., 218 formed of GaN have a lattice constant of 0.3189 nm, which is smaller than that of the substrate 10, and a thermal expansion coefficient of $5.59 \times 10^{-6}$/K, which is greater than that of the substrate 10. Further, the intermediate layer 12 and the second semiconductor layers 22, ..., 22 formed of AlN have a lattice constant of 0.3112 nm, which is smaller than that of the first semiconductor layers 211, ..., 218, and a thermal expansion coefficient of $4.2 \times 10^{-6}$/K, which is greater than that of the substrate 10.

As described above, the field effect transistor 100 is fabricated by first growing the intermediate layer 12, the buffer layer 20, the semiconductor active layer 40 on the substrate 10 of 4 inches in diameter, for example, by an epitaxial crystal growth method such as MOCVD method at a substrate temperature of 1000 to 1100° C., forming the source electrode 51, the drain electrode 52 and the gate electrode 53, and separating the wafer into each device.

Figure 2:
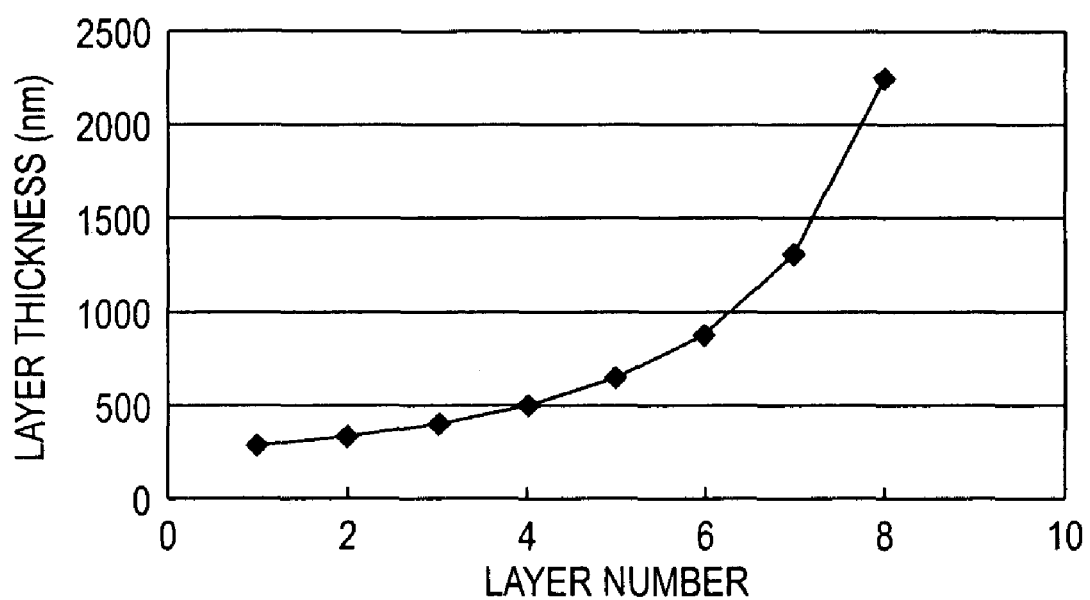
FIG. 2 is a graph showing a relationship between a layer number of a first semiconductor layer and a layer thickness in the first embodiment.

A thickness of the intermediate layer 12 is 40 nm, for example. Further, the first semiconductor layers 211, ..., 218 are formed such that the thickness thereof increases exponentially in a direction of lamination. FIG. 2 is a graph showing a relationship between a layer number and a layer thickness. As shown in FIG. 2, the first semiconductor layer 211 located at first position as counted from the substrate 10 has a thickness of 300 nm. The layer thicknesses increases in the direction of lamination, and the first semiconductor layer 218 located at eighth position has a thickness of 2237 nm. On the other hand, the second semiconductor layers 22, ..., 22 all have a thickness of 60 nm. Accordingly, the thickness of the buffer layer 20 is 7.18 μm. Further, the thickness of the semiconductor active layer 40 is 1.35 μm, which leads to the total layer thickness of the epitaxial layer including the semiconductor active layer 40 and the buffer layer 20 being about 8.52 μm.

Being constructed as described above, the field effect transistor 100 has a high breakdown voltage and small warp.

Figure 3:
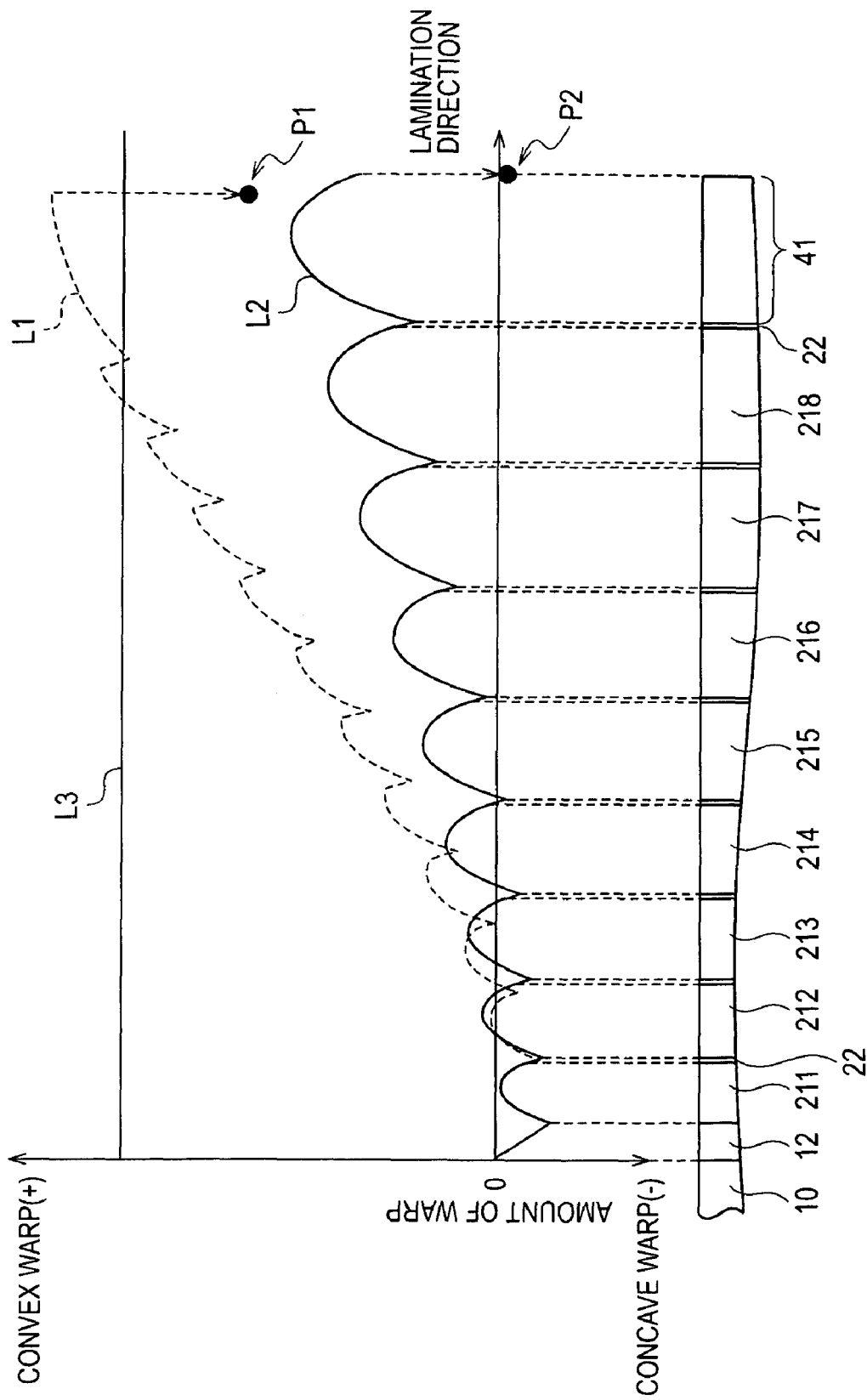
FIG. 3 is an explanatory diagram showing a direction and an amount of warp of an epitaxial wafer when forming each layer on a substrate in the first embodiment.

An explanation will be given in detail below. FIG. 3 is an explanatory diagram showing a direction and an amount of warp of an epitaxial wafer when forming each layer on the substrate 10 shown in FIG. 1. In FIG. 3, the horizontal axis corresponds to a direction of lamination and the vertical axis represents an amount of warp with a convex warp corresponding to plus (+) and a concave warp corresponding to minus (−). Further, the line L2 represents an amount of warp during epitaxial growth in the first embodiment, while the line L1 represents an amount of warp during epitaxial growth in the case in which all the first semiconductor layers are equal in thickness. The growth of each layer is performed at the substrate temperature of 1000 to 1100° C., as described above.

First, when the intermediate layer 12 is formed on the substrate 10, a warp in the concave direction occurs, as shown by the line L2, because a lattice constant of the intermediate layer 12 is smaller than that of the substrate 10. Thereafter, when the first semiconductor layer 211 located at first position is formed on the intermediate layer 12, a warp is added in the convex direction for the duration of time in which the first semiconductor layer is thin, because a lattice constant of the first semiconductor layer 211 is greater than that of the intermediate layer 12. However, when the thickness of the first semiconductor layer exceeds a certain value, a warp is added in the concave direction so as to cancel the convex warp, because a lattice constant of the first semiconductor layer 211 is smaller than that of the substrate 10. Hereinafter, the thickness of the semiconductor layer above which a direction of warp added by the semiconductor layer to the epitaxial wafer is inverted from the convex direction to the concave direction is referred to as 'critical thickness'. That is, the critical thickness refers to a thickness at which an amount of warp is maximal with respect to a change in the thickness of the semiconductor layer. In the first embodiment, the critical thickness of the first semiconductor layer 211 is about 200 nm.

Thereafter, when the second semiconductor layer 22 is formed on the first semiconductor layer 211, a warp is added in the concave direction because a lattice constant of the second semiconductor layer 22 is smaller than that of the first semiconductor layer 211.

Then, a first semiconductor layer 212 is formed on the second semiconductor layer 22. Like in the case of the first semiconductor layer 211, a warp in the convex direction is added for the duration of time in which a thickness of the second semiconductor layer 212 is thin. When the thickness exceeds a certain critical thickness, a warp in the concave direction begins to be added. The critical thickness of the first semiconductor layer 212 is greater than the critical thickness of the first semiconductor layer 211. The reason for this is considered to be based on the first semiconductor layer 212 being affected by the semiconductor layers (foundation layer) comprised of the intermediate layer 12, the first semiconductor layer 211, and the second semiconductor layer 22, which are formed under the first semiconductor layer 212.

If the thicknesses of the first semiconductor layer 212 and the first semiconductor layer 211 are equal, the amount of warp added in the convex direction by the first semiconductor layer 212 is small. However, in the present first embodiment, the first semiconductor layer 212 is thicker than the first semiconductor layer 211. Accordingly, though the critical thickness of the first semiconductor layer 212 is greater than that of the first semiconductor layer 211, the amount of warp in the concave direction added by the first semiconductor layer 212 is kept large.

Figure 4:
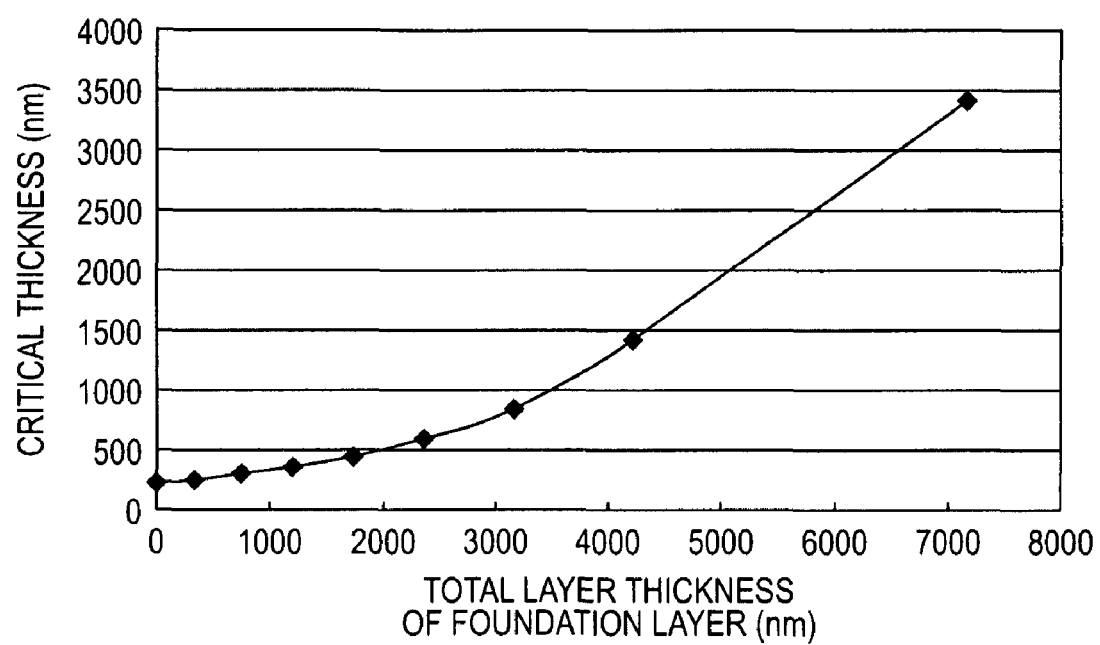
FIG. 4 is a graph exemplarily showing a relationship between a total layer thickness of a foundation layer for a certain first semiconductor layer and a critical thickness.

Similarly, as the first semiconductor layer 213, 214, . . . are formed with the second semiconductor layer 22 interposed therebetween, the total layer thickness of the foundation layer becomes large so the critical thickness becomes large. FIG. 4 is a graph exemplarily showing a relationship between a total layer thickness of the foundation layer for a certain first semiconductor layer and the critical thickness. As shown in FIG. 4, the critical thickness increases as the total layer thickness of the foundation layer increases.

In the field effect transistor 100, the thicknesses of the first semiconductor layers 213, 214, . . . , 218 increases in the direction of lamination. In addition, each layer thickness of the first semiconductor layers 213, 214, . . . , 218 is greater than the critical thickness at each lamination position. Accordingly, an amount of warp in the concave direction added in each of the first semiconductor layers 211, . . . , 218 is kept large, as shown in FIG. 3, so the warp added in the convex direction is cancelled and is extremely small.

Finally, a semiconductor active layer 40 is formed and the epitaxial growth is ended. In the growth step of the semiconductor active layer 40 also, a warp occurs in the convex direction as a whole. Thereafter, the substrate temperature is lowered from 1000-1100° C. to a normal temperature. Because thermal expansion coefficients of the buffer layer 20, the intermediate layer 12 and the semiconductor active layer 40 are all greater than that of the substrate 10, a warp in the concave direction occurs as the substrate temperature falls, and finally, the amount of warp becomes small as designated by the point P2.

On the other hand, if the thicknesses of the first semiconductor layers are all set to an identical value of, for example, 300 nm, the first semiconductor layers near the substrate do not serve to generate sufficient warp in the concave direction, and the first semiconductor layers far from the substrate do not serve to restrain the generation of warp in the convex direction, as shown by the line L1. Accordingly, the resultant warp is large as designated by the point P1. Further, when forming a thick buffer layer in such a state that a large amount of warp occurs, the amount of warp will exceed an allowable limit designated by the line L3 at the buffer layer thickness of about 6 μm, whereby it is possible that the epitaxial wafer is broken.

Further, when the thicknesses of the first semiconductor layers are all set to an identical value, if the layers are thin, the warp of the epitaxial wafer can be restrained. In this case, however, a total layer thickness of the epitaxial layers is small, which makes it difficult to increase a breakdown voltage of a device.

On the other hand, the field effect transistor 100 has a high breakdown voltage and a reduced warp. Further, a breakage of an epitaxial wafer is prevented. In addition, the warp is cancelled in each of the first semiconductor layers 211, . . . , 218, so the immanent strain is reduced extremely.

As a first example of the present invention, a field effect transistor was fabricated according to the present first embodiment, using a Si substrate of 4 inches in diameter, with a total layer thickness of the epitaxial layer being 8.52 μm. An amount of warp of the epitaxial wafer (BOW) before separating into each device was a good value of 30 μm. As a result, field effect transistors with a reduced warp after separation were obtained. A breakdown voltage of the field effect transistor obtained was measured, and a superior value of 2500V was obtained.

On the other hand, as a first comparative example of the present invention, a field effect transistor with a similar structure except for thicknesses of the first semiconductor layers being set at an identical value of 300 nm was tried to be fabricated. A total layer thickness of the epitaxial layer would have exceeded 6 μm. However, a warp of the epitaxial wafer was so large that the epitaxial wafer was broken during the epitaxial growth process.

In the first embodiment, the thickness of the first semiconductor layer 211, which is the thinnest first semiconductor layer of all the first semiconductor layers, is 300 nm. It is preferable that the thickness of the first semiconductor layer 211 is not less than 400 nm because an amount of warp in the concave direction is sufficiently large. In addition, it is preferable that the thicknesses of the first semiconductor layers 211, . . . , 218 are not greater than 3000 nm because a growth duration time is sufficiently short and productivity is high.

Further, it is preferable that the thicknesses of the second semiconductor layers 22 are not less than 0.5 nm and not greater than 200 nm because the immanent strain in the first semiconductor layers 211, . . . , 218 is sufficiently restrained.

The thicknesses of the first semiconductor layers 211, . . . , 218, the second semiconductor layers 22, . . . , and the intermediate layer 12 are not limited to those described in the first embodiment, but may be suitably selected according to their compositions, the differences in a lattice constant and a thermal expansion coefficient from the substrate 10, a required breakdown voltage, an allowable amount of warp or the like.

Second Embodiment

A second embodiment of the present invention is explained below. In the first embodiment, the first semiconductor layers are formed so that the thickness increases in a direction of lamination. On the other hand, in the second embodiment, the first semiconductor layers having a thickness not less than a critical thickness are located at a portion higher than two thirds of the number of the composite layers of the buffer layer.

Figure 5:
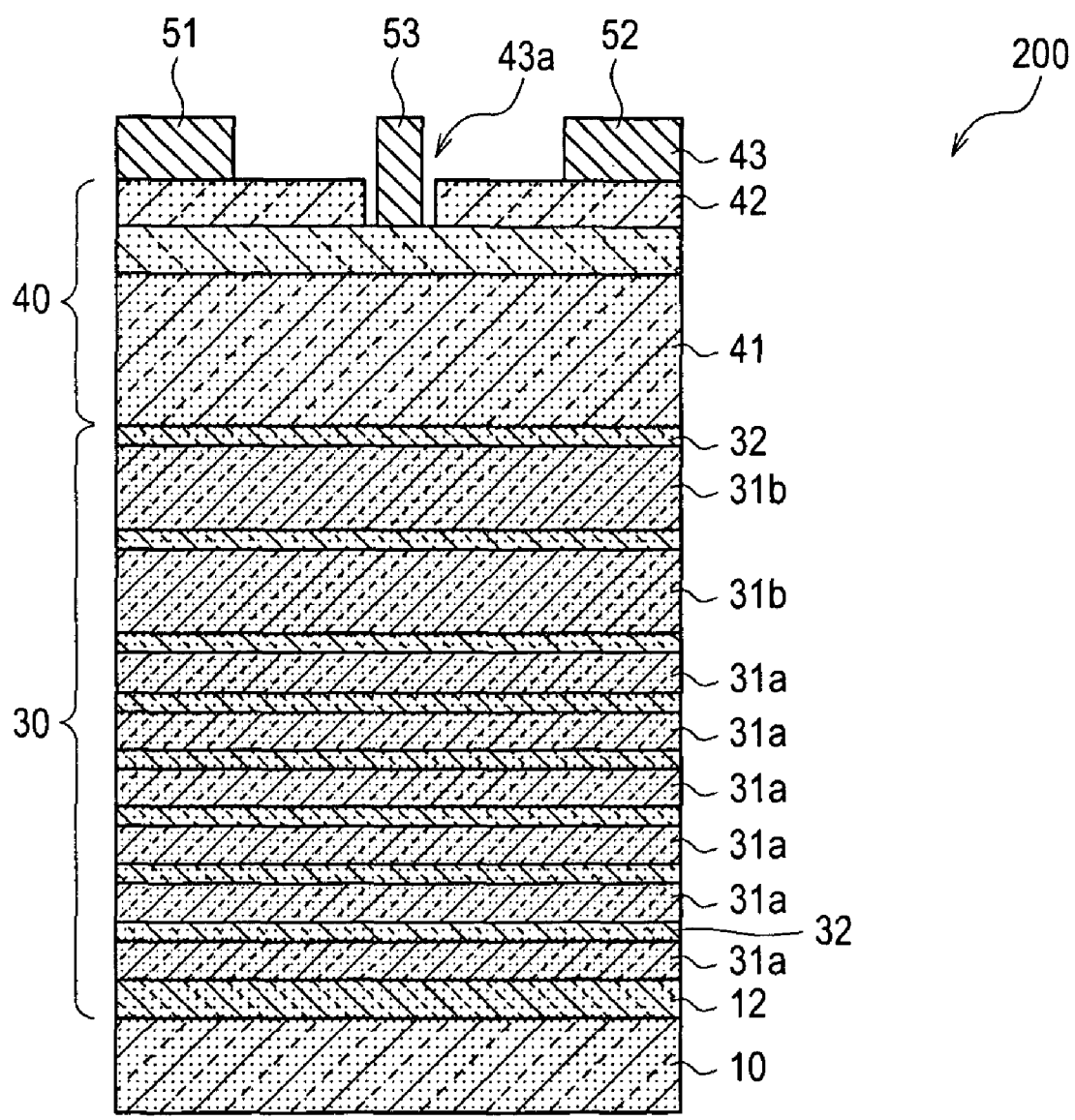
FIG. 5 is a cross sectional view schematically showing a field effect transistor according to a second embodiment of the present invention.

FIG. 5 is a cross sectional view schematically showing a field effect transistor according to the second embodiment. The field effect transistor 200 includes a substrate 10, an intermediate layer 12, a semiconductor active layer 40 in which an electron drift layer 41, an electron supplying layer 42, and a contact layer 43 are sequentially formed, a source electrode 51, a drain electrode 52, and a gate electrode 53, which are similar to those in the first embodiment. The field effect transistor 200 has a buffer layer 30 instead of the buffer layer 20 of the first embodiment.

The buffer layer 30 is a layered structure in which first semiconductor layers 31a, . . . , 31a, 31b, 31b formed of undoped GaN and second semiconductor layer 32, . . . , 32 formed of undoped AlN are alternately formed. A pair of a first semiconductor layer and a neighboring second semiconductor layer being considered as one composite layer, the buffer layer 30 includes eight composite layers.

Figure 6:
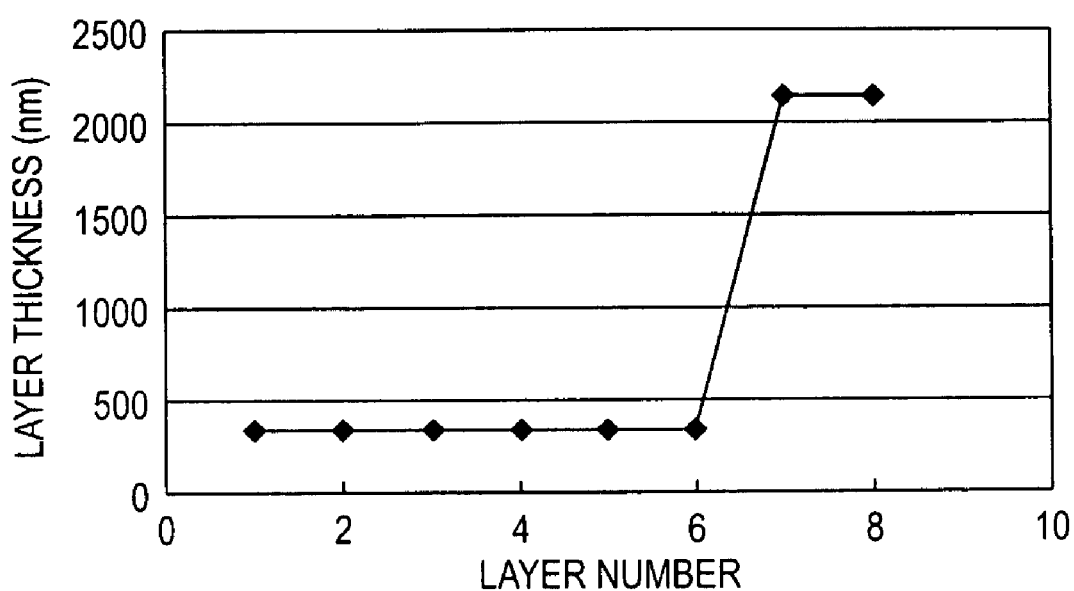
FIG. 6 is a graph showing a relationship between a layer number of a first semiconductor layer and a layer thickness in the second embodiment.

The second semiconductor layers 32, 32 have all an identical thickness of 60 nm. On the other hand, FIG. 6 is a graph showing a relationship between a layer number of the first semiconductor layer and a layer thickness. As shown in FIG. 6, the first semiconductor layers 31a, . . . , 31a located at first to sixth positions as counted from the substrate 10 all has an identical thickness of 340 nm. The first semiconductor layer 31b, 31b located at seventh and eighth positions as counted from the substrate 10 both has a thickness of 2140 nm. Therefore, a thickness of the buffer layer 30 is 6.80 μm, which leads to a total layer thickness of the epitaxial layer including the semiconductor active layer 40 and the buffer layer 30 being about 8.15 μm.

In the buffer layer 30, the first semiconductor layers 31a, 31a near the substrate 10 has relatively a small thickness and the first semiconductor layers 31b, 31b located at upper position has a thickness sufficiently greater than a critical thickness. Accordingly, the field effect transistor 200 has a high breakdown voltage and a reduced warp.

Figure 7:
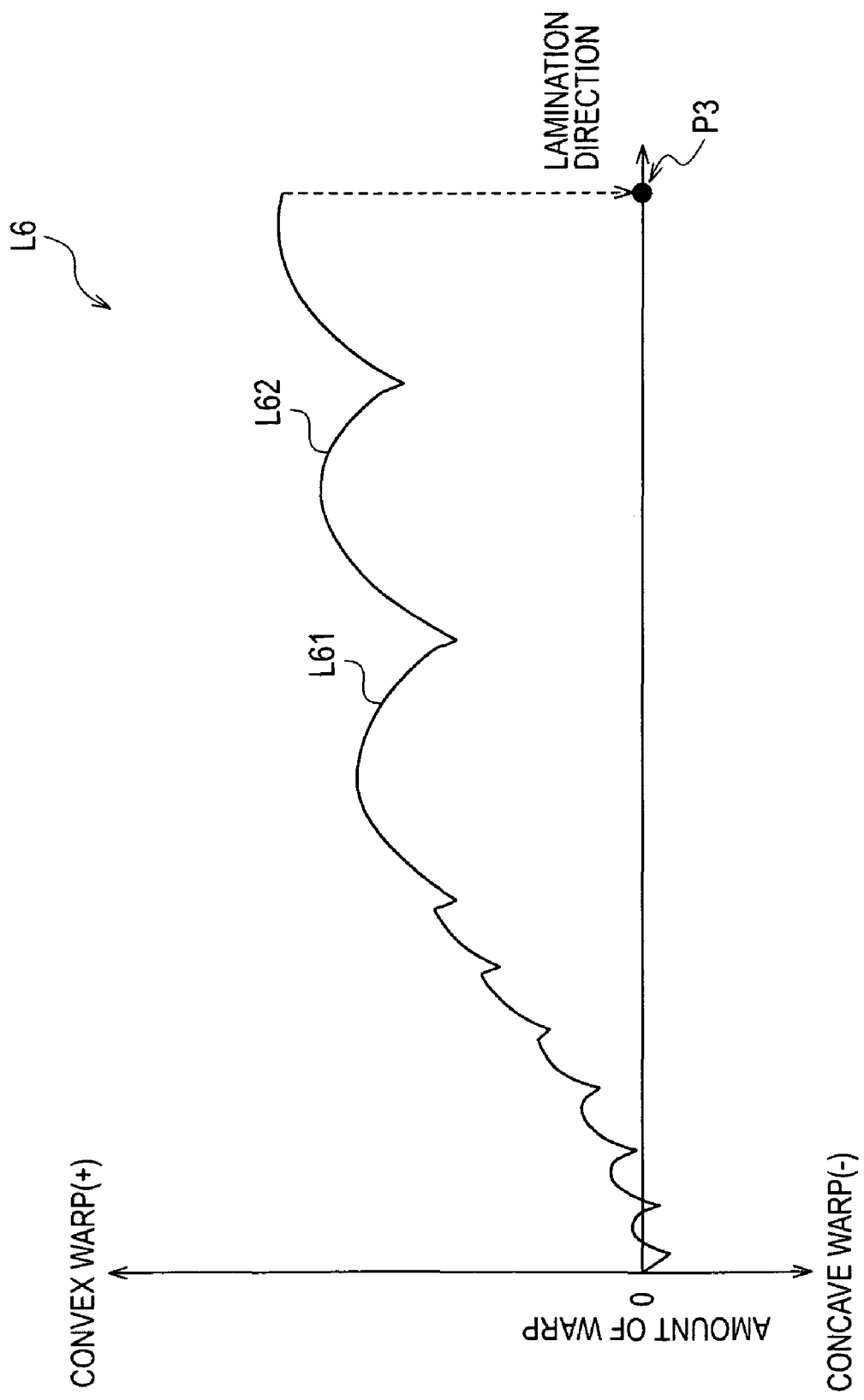
FIG. 7 is an explanatory diagram showing a direction and an amount of warp of an epitaxial wafer when forming each layer on a substrate in the second embodiment.

FIG. 7 is an explanatory diagram showing a direction and an amount of warp of the epitaxial wafer when forming each layer on the substrate 10 shown in FIG. 5. The line L6 represents an amount of warp during epitaxial growth. The line segments L61, L62 represent amounts of warp added by the first semiconductor layers 31b, 31b. As shown in FIG. 7, in the field effect transistor 200, the thicknesses of the first semiconductor layers 31a, . . . , 31a located near the substrate 10 are set relatively small to restrain a generation of warp in the convex direction, and the thicknesses of the first semiconductor layers 31b, 31b located at upper positions are set sufficiently greater than a critical thickness to cause a large amount of warp in the concave direction, thereby restraining a warp in the convex direction to a large extent. As a result, the amount of warp in the convex direction is restrained despite an increased number of composite layers in the buffer layer 30, and finally, the amount of warp becomes small as designated by the point P3. Therefore, the field effect transistor 200 has a high breakdown voltage and a reduced warp.

In the field effect transistor 200, the critical thickness becomes the greatest for the first semiconductor layer 31b located at eighth position as counted from the substrate 10, which is about 1500 nm. The thickness of the first semiconductor layer 31b is 2140 nm and sufficiently greater than the critical thickness. Accordingly, a sufficient amount of warp in the concave direction occurs. In addition, because the critical thickness for the first semiconductor layer 31b located at seventh position as counted from the substrate 10 is smaller than that for the first semiconductor layer 31b located at eighth position, a larger amount of convex warp occurs in the first semiconductor layer 31b located at seventh position.

Further, in the second embodiment, the first semiconductor layers 31b, 31b having a thickness greater than the critical thickness are located at portions higher than two thirds of the number of the composite layers of the buffer layer 30. Therefore, a frequency of combination and extinction of dislocations will increase, leading to a reduction of dislocations, an improvement in crystal quality of the buffer layer 30, and an improvement of crystal quality of the semiconductor active layer 40 formed on the buffer layer 30 as well.

Third Embodiment

Figure 8:
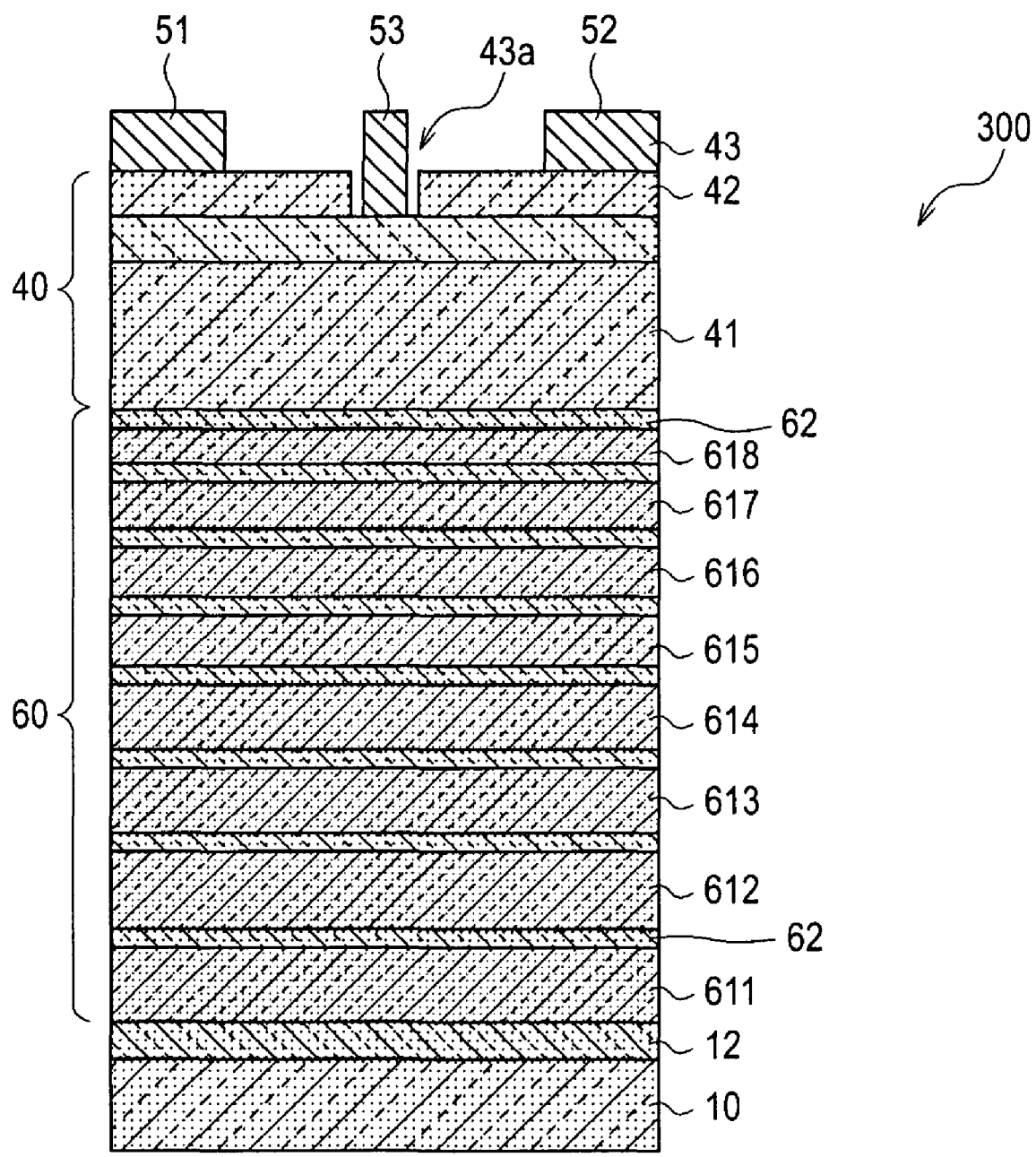
FIG. 8 is a cross sectional view schematically showing a field effect transistor according to a third embodiment of the present invention.

FIG. 8 is a cross sectional view schematically showing a field effect transistor according to a third embodiment of the present invention. The field effect transistor 300 includes a substrate 10, an intermediate layer 12, a semiconductor active layer 40 in which an electron drift layer 41, an electron supplying layer 42, and a contact layer 43 are sequentially formed, a source electrode 51, a drain electrode 52, and a gate electrode 53, which are similar to those in the first embodiment. The field effect transistor 300 has a buffer layer 60 instead of the buffer layer 20 of the first embodiment.

The buffer layer 60 is a layered structure in which first semiconductor layers 611, . . . , 618 formed of undoped GaN and second semiconductor layers 62, . . . , 62 formed of undoped AlN are alternately formed. A pair of a first semiconductor layer and a neighboring second semiconductor layer being considered as one composite layer, the buffer layer 60 includes eight composite layers.

A thickness of the intermediate layer 12 is, for example, 40 nm. Further, the first semiconductor layers 611, . . . , 618 are formed such that the thickness thereof decreases in a direction of lamination. That is, the first semiconductor layer 611 is 440 nm in thickness. The thickness of the first semiconductor layers decrease in a direction of lamination by a step of 30 nm, and the first semiconductor layer 618 is 230 nm in thickness. On the other hand, the second semiconductor layers 62, . . . , 62 all have a thickness of 30 nm. Accordingly, the thickness of the buffer layer 60 is 2.92 μm. Further, the thickness of the semiconductor active layer 40 is 1.02 μm, which leads to the total layer thickness of the epitaxial layer including the semiconductor active layer 40 and the buffer layer 60 being about 3.98 μm.

Because the first semiconductor layers 611, . . . , 618 of the buffer layer 60 are formed such that the thickness thereof decreases in a direction of lamination, the field effect transistor 300 has a high breakdown voltage and small warp.

Figure 9:
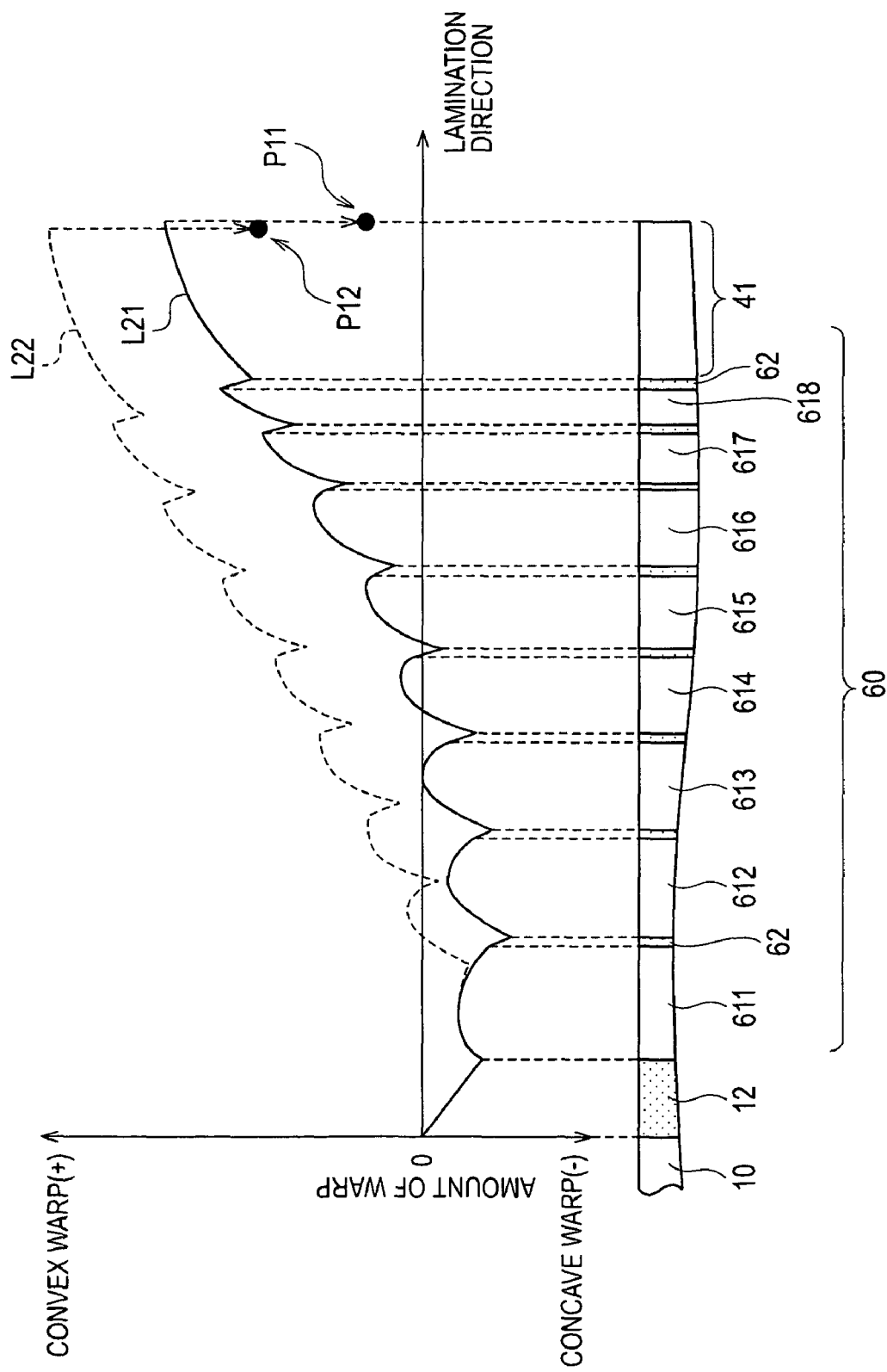
FIG. 9 is an explanatory diagram showing a direction and an amount of warp of an epitaxial wafer when forming each layer on a substrate in the third embodiment.

An explanation will be given in detail below. FIG. 9 is an explanatory diagram showing a direction and an amount of warp of an epitaxial wafer when forming each layer on the substrate 10 shown in FIG. 8. In FIG. 9, the horizontal axis corresponds to a direction of lamination and the vertical axis represents an amount of warp with a convex warp corresponding to plus (+) and a concave warp corresponding to minus (−). Further, the line L21 represents an amount of warp during epitaxial growth in the third embodiment, while the line L22 represents an amount of warp during epitaxial growth in the case in which all the first semiconductor layers are equal in thickness. The growth of each layer is performed at the substrate temperature of 1000 to 1100° C., as described above.

First, when the intermediate layer 12 is formed on the substrate 10, a warp in the concave direction occurs, as shown by the line L21, because a lattice constant of the intermediate layer 12 is smaller than that of the substrate 10. Thereafter, when the first semiconductor layer 611 located at first position as counted from the substrate 10 is formed on the intermediate layer 12, a warp in the convex direction is added for the duration of time in which the first semiconductor layer 611 is thin, because a lattice constant of the first semiconductor layer 611 is greater than that of the intermediate layer 12. However, when the thickness of the first semiconductor layer 611 exceeds a certain value, a warp in the concave direction begins to be added, because a lattice constant of the first semiconductor layer 611 is smaller than that of the substrate 10. In the present third embodiment, the critical thickness of the first semiconductor layer 611 is about 200 nm.

Thereafter, when the second semiconductor layer 62 is formed on the first semiconductor layer 611, a warp in the concave direction is added because a lattice constant of the second semiconductor layer 62 is smaller than that of the first semiconductor layer 611.

Then, a first semiconductor layer 612 is formed on the second semiconductor layer 62. Like in the case of the first semiconductor layer 611, a warp in the convex direction is added for the duration of time in which a thickness of the first semiconductor layer 612 is thin. When the thickness exceeds a certain critical thickness, a warp in the concave direction begins to be added. The critical thickness of the first semiconductor layer 612 is greater than the critical thickness of the first semiconductor layer 611. As a result, the warp in the concave direction added by the first semiconductor layer 612 becomes smaller than that added by the first semiconductor layer 611.

Similarly, as the first semiconductor layer 613, 614, are formed with the second semiconductor layer 62 interposed therebetween, the total layer thickness of the foundation layer becomes large so the critical thickness becomes large. Then, if all the first semiconductor layers are equal in thickness, the critical thickness soon exceeds the thickness of the first semiconductor layer. In this case, the warp is accumulated only in the convex direction to a large extent.

However, in the present third embodiment, the first semiconductor layers 611, . . . , 618 are formed such that the thickness thereof decreases in a direction of lamination. The thickness of the first semiconductor layer 618 is sufficiently smaller than the critical thickness. Accordingly, although a warp in the convex direction occurs, the amount of the warp is small.

That is, in the present third embodiment, the thickness of the first semiconductor layers 611 etc., which have a small critical thickness, are set to a large value so as to generate a warp in the concave direction as much as possible, while the thickness of the first semiconductor layers 618 etc., which have a large critical thickness and therefore are unapt to generate a warp in the concave direction, are set small so as to restrain an amount of warp in the convex direction. As a result, the amount of warp in the convex direction is restrained despite an increased number of composite layers in the buffer layer 60.

Finally, a semiconductor active layer 40 is formed and the epitaxial growth is ended. In the growth step of the semiconductor active layer 40 also, a warp occurs in the convex direction. Thereafter, the substrate temperature is lowered from 1000-1100° C. to a normal temperature. Because thermal expansion coefficients of the buffer layer 60, the intermediate layer 12 and the semiconductor active layer 40 are all greater than that of the substrate 10, a warp in the concave direction occurs as the substrate temperature falls, and finally, the amount of warp becomes small as designated by the point P11.

On the other hand, if the thicknesses of the first semiconductor layers are all set to an identical value of, for example, 300 nm, the first semiconductor layers near the substrate do not serve to generate sufficient warp in the concave direction, and the first semiconductor layers far from the substrate do not serve to restrain the generation of warp in the convex direction, as shown by the line L22. Accordingly, the resultant warp is large as designated by the point P22. Note that even when the first semiconductor layer located at eighth position as counted from the substrate is grown to a thickness of 500 nm, a warp in the concave direction is not observed. Therefore, the critical thickness is considered to be greater than 500 nm.

As described above, according to the third embodiment, a field effect transistor 300 having a high breakdown voltage and a reduced warp can be realized.

As a second example of the present invention, a field effect transistor was fabricated according to the present third embodiment, using a Si substrate of 4 inches in diameter, with a total layer thickness of the epitaxial layer being 3.98 µm. An amount of warp of the epitaxial wafer (BOW) before separating into each device was a good value of 30 µm. As a result, field effect transistors with a reduced warp after separation were obtained. A breakdown voltage of the field effect transistor obtained was measured, and a superior value of 1200V was obtained.

On the other hand, as a second comparative example of the present invention, a field effect transistor with a similar structure except for thicknesses of the first semiconductor layers being set at an identical value of 300 nm and a total layer thickness being 3.7 µm was fabricated. An amount of warp of the epitaxial wafer (BOW) before separating into each device was as large as about 100 µm. Further, as a third comparative example, a field effect transistor with a similar structure to the second example except for thicknesses of the first semiconductor layers being set at an identical value of 250 nm was fabricated. An amount of warp of the epitaxial wafer in this case was a good value of about 30 µm. However, a measurement of the breakdown voltage of the separated device showed a low value of 1000V, because a total layer thickness of the epitaxial layer was as small as 3.3 µm.

In the above-described third embodiment, it is preferable that the thickness of the first semiconductor layer 611, which is the thickest of all the first semiconductor layers, is not less than 400 nm, because a warp in the convex direction that occurs during the epitaxial growth process can be made sufficiently large. Further, it is preferable that the thickness is not greater than 3000 nm, because a growth duration time is sufficiently short and productivity is high.

Further, it is preferable that the thicknesses of the second semiconductor layers 62 are not less than 0.5 nm and not greater than 200 nm because the strain immanent in the first semiconductor layers 611, . . . , 618 is sufficiently restrained.

The thicknesses of the first semiconductor layers 611, . . . , 618, the second semiconductor layers 62, . . . , 62 and the intermediate layer 12 are not limited to those described in the third embodiment, but may be suitably selected according to their compositions, the differences in a lattice constant and a thermal expansion coefficient from the substrate 10, a required breakdown voltage, an allowable amount of warp or the like.

Fourth Embodiment

A fourth embodiment of the present invention will be explained below. In the third embodiment, the first semiconductor layers are formed so that the thickness decreases in a direction of lamination. On the other hand, in the fourth embodiment, any one of the first semiconductor layers located at first to fourth positions as counted from the substrate is not less than 400 nm and not greater than 3000 nm in thickness, and thicker than other first semiconductor layers.

Figure 10:
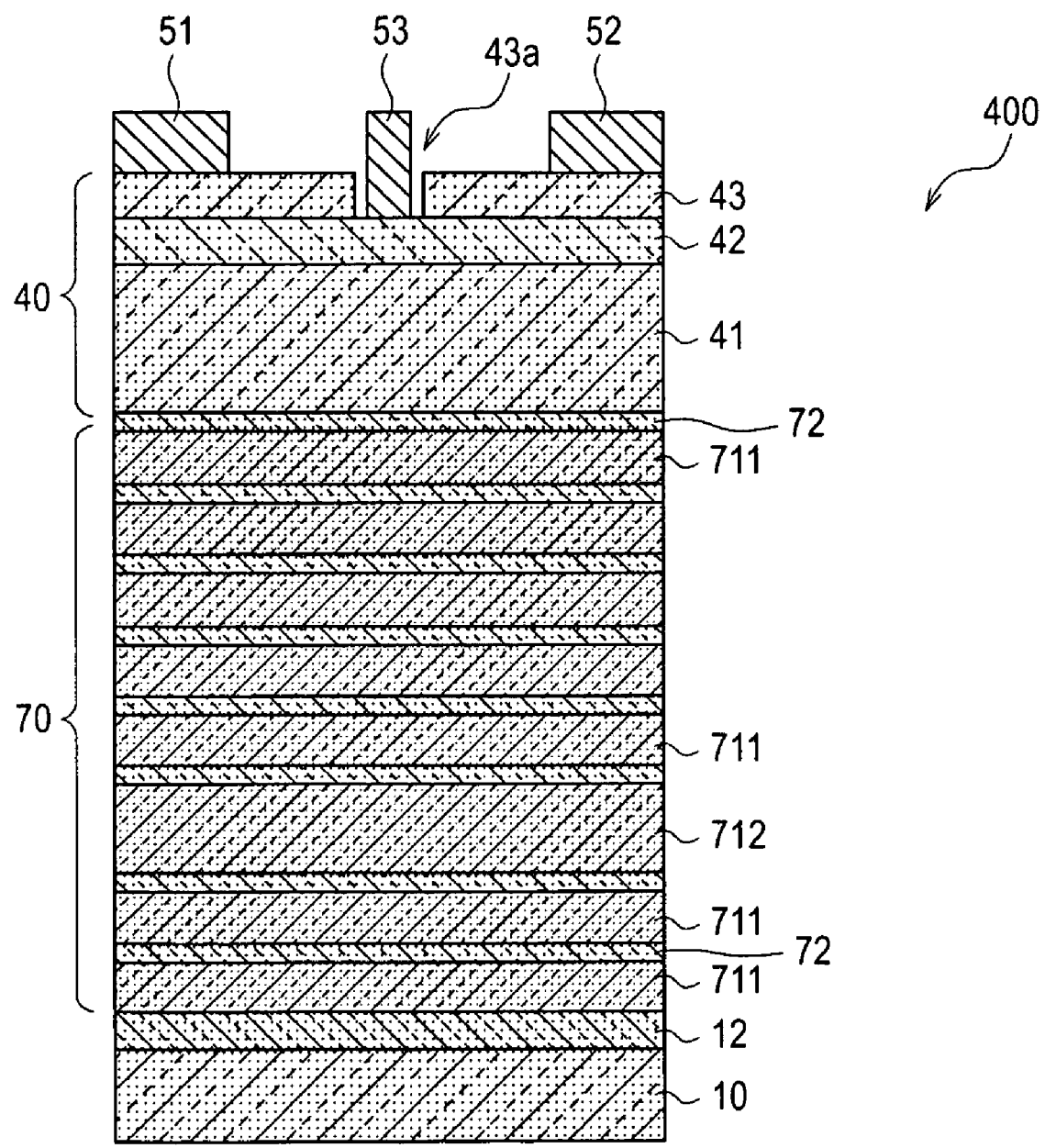
FIG. 10 is a cross sectional view schematically showing a field effect transistor according to a fourth embodiment of the present invention.

FIG. 10 is a cross sectional view schematically showing a field effect transistor according to a fourth embodiment. The field effect transistor 400 includes a substrate 10, an intermediate layer 12, a semiconductor active layer 40 in which an electron drift layer 41, an electron supplying layer 42, and a contact layer 43 are sequentially formed, a source electrode 51, a drain electrode 52, and a gate electrode 53, which are similar to those in the first embodiment. The field effect transistor 400 has a buffer layer 70 instead of the buffer layer 20 of the first embodiment.

The buffer layer 70 is a layered structure in which first semiconductor layers 711, 711, 712, 711, . . . , 711 formed of undoped GaN and second semiconductor layers 72, . . . , 72 formed of undoped AlN are alternately formed. A pair of a first semiconductor layer and a neighboring second semiconductor layer being considered as one composite layer, the buffer layer 70 includes eight composite layers.

The second semiconductor layers 72, . . . , 72 all have a thickness of 30 nm. On the other hand, the first semiconductor layer 712 located at third position as counted from the substrate 10 is 800 nm in thickness, and all the other first semiconductor layers 711, . . . , 711 are 300 nm in thickness. That is, the first semiconductor layer 712 is thicker than the other first semiconductor layers 711, . . . , 711. The thickness of the buffer layer 70 is 3.180 µm, and a total layer thickness of the epitaxial layer including the semiconductor active layer 40 and the buffer layer 70 is 4.2 µm.

Because the first semiconductor layer 712 of the buffer layer 70, which is the first semiconductor layer located at third position as counted from the substrate 10, is 800 nm in thickness and thicker than the other first semiconductor layers 711, . . . , 711, the field effect transistor 400 has a high breakdown voltage and small warp.

Figure 11:
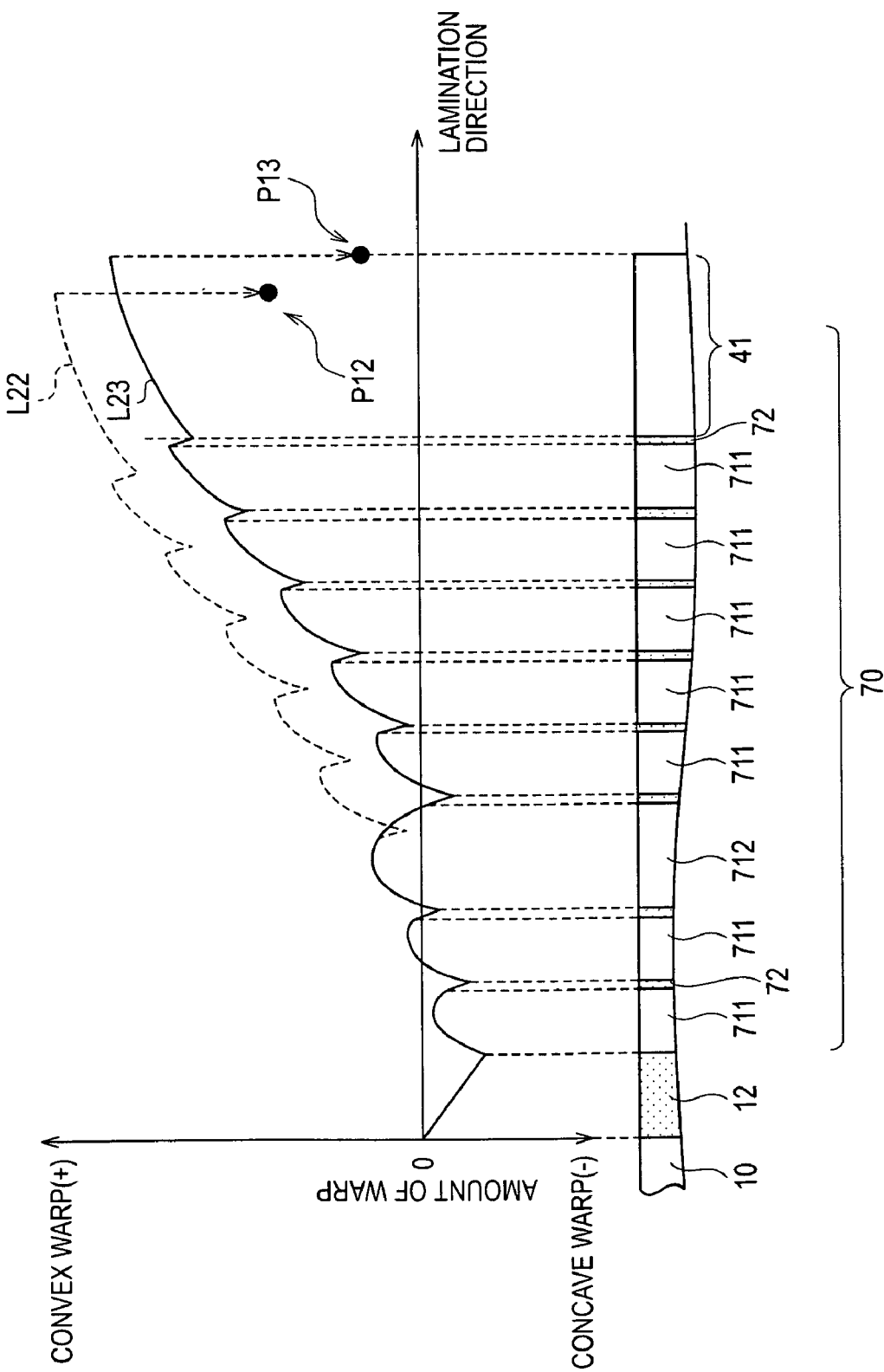
FIG. 11 is an explanatory diagram showing a direction and an amount of warp of an epitaxial wafer when forming each layer on a substrate in the fourth embodiment.

An explanation will be given in detail below. FIG. 11 is an explanatory diagram showing a direction and an amount of warp of an epitaxial wafer when forming each layer on a substrate 10 shown in FIG. 10. The line L23 represents an amount of warp during epitaxial growth in the fourth embodiment. The line L22 is the same as that shown in FIG. 9.

As shown in FIG. 11, in the fourth embodiment, an amount of warp in the concave direction generated in the first semiconductor layer 712 is large because the first semiconductor layer 712 is thick. As a result, despite the other first semiconductor layers 711, . . . , 71 which are equal in thickness, an accumulation of warp as a whole is prevented, unlike the case represented by the line L22. The amount of warp after forming the semiconductor active layer 40 is designated by the point P13, which shows a smaller amount of warp than that represented by the point P12.

As a third example of the present invention, a field effect transistor was fabricated according to the present fourth embodiment, using a Si substrate of 4 inches in diameter, with a total layer thickness of the epitaxial layer being 3.82 µm. An amount of warp of the epitaxial wafer (BOW) before separating into each device was a good value of 60 µm. As a result, field effect transistors with a reduced warp after separation were obtained. A breakdown voltage of the field effect transistor obtained was measured, and a superior value of 1300V was obtained.

The position of the first semiconductor layer 712 the thickness of which is to be thickened is not limited to the third layer as counted from the substrate 10, but may be any one of first to fourth layer. The first semiconductor layers located at first to fourth positions as counted from the substrate 10 have a critical thickness of not greater than about 400 nm. Therefore, if any one of the first semiconductor layers located at first to fourth positions is not less than 400 nm in thickness, a sufficiently large amount of warp in the concave direction can be generated during epitaxial growth.

Further, it is preferable that the thickness of the first semiconductor layer 712 the thickness of which is to be thickened is not greater than 3000 nm, because a growth duration time is sufficiently short and productivity is high.

Further, the first semiconductor layer 712 which is to be thickened is not limited to one layer, but may be plural layers.

In the field effect transistors according to the above first to fourth embodiments, the buffer layer 20, 30, 60, 70 may be replaced with a buffer layer in which the thickness of the first semiconductor layers is non-uniform thereamong and at least one of the first semiconductor layers is thicker than a critical thickness.

Fifth Embodiment

A fifth embodiment of the present invention will be explained below. In the third embodiment, the first semiconductor layers are formed so that the thickness decreases in a direction of lamination. On the other hand, in the fifth embodiment, the second semiconductor layers are formed such that the thickness decreases in a direction of lamination.

Figure 12:
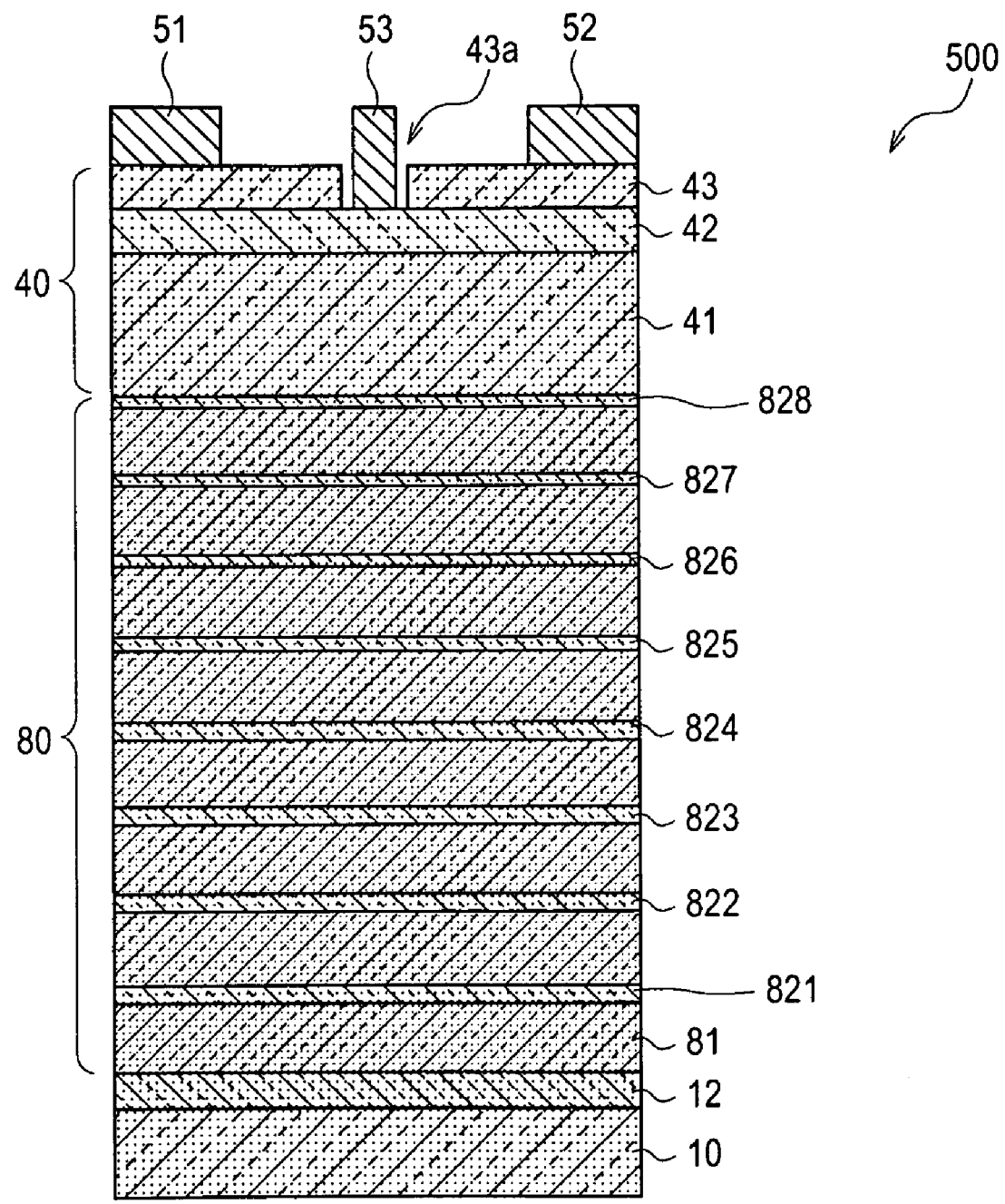
FIG. 12 is a cross sectional view schematically showing a field effect transistor according to a fifth embodiment of the present invention.

FIG. 12 is a cross sectional view schematically showing a field effect transistor according to a fifth embodiment. The field effect transistor 500 includes a substrate 10, an intermediate layer 12, a semiconductor active layer 40 in which an electron drift layer 41, an electron supplying layer 42, and a contact layer 43 are sequentially formed, a source electrode 51, a drain electrode 52, and a gate electrode 53, which are similar to those in the first embodiment. The field effect transistor 500 has a buffer layer 80 instead of the buffer layer 20 of the first embodiment.

The buffer layer 80 is a layered structure in which first semiconductor layers 81, . . . , 81 formed of undoped GaN and second semiconductor layers 821, . . . , 828 formed of undoped AlN are alternately formed. A pair of a first semiconductor layer and a neighboring second semiconductor layer being considered as one composite layer, the buffer layer 80 includes eight composite layers.

The first semiconductor layers 81, . . . , 81 all have a thickness of 300 nm. On the other hand, the second semiconductor layers 821, . . . , 828 are formed such that the thickness thereof decreases in a direction of lamination. That is, the second semiconductor layer 821 is 40 nm in thickness. The thickness of the second semiconductor layers decrease in a direction of lamination by a step of 3 nm, and the second semiconductor layer 828 is 19 nm in thickness. Accordingly, the thickness of the buffer layer 80 is 2.676 µm, which leads to the total layer thickness of the epitaxial layer including the semiconductor active layer 40 and the buffer layer 80 being 3.696 µm.

Because the second semiconductor layers 821, . . . , 828 of the buffer layer 80 are formed such that the thickness thereof decreases in a direction of lamination, the field effect transistor 500 has a high breakdown voltage and small warp.

That is, as described above, in the field effect transistor 300, the thicknesses of the second semiconductor layers 62, . . . , 62 are equal. Therefore, as the first semiconductor layers 612, 613, . . . are formed with the second semiconductor layer 62 interposed therebetween, the total layer thickness of the foundation layer becomes large proportionally so the critical thickness becomes large.

On the other hand, in the field effect transistor 500, when the first semiconductor layers 81, . . . are formed with the second semiconductor layers 821, . . . interposed therebetween, the total layer thickness of the second semiconductor layers 821, . . . , by which the first semiconductor layer 81 is affected, is restrained from becoming large so that the critical thickness is restrained from becoming large. As a result, the thickness of the first semiconductor layer can be larger than the critical thickness even for the first semiconductor layer 81 distant from the substrate 10. Accordingly, a generation of warp in the convex direction during epitaxial growth is restrained.

In the present fifth embodiment, the critical thickness is the largest at the first semiconductor layer 81 located at eighth position as counted from the substrate 10, which is about 250 nm. Therefore a generation of warp in the convex direction during epitaxial growth is restrained in every first semiconductor layers 81. As a result, in the fifth embodiment also, it is possible to increase a number of composite layers in the buffer layer 80 while restraining the warp of the epitaxial wafer. Accordingly, the field effect transistor 500 has a high breakdown voltage and small warp.

Sixth Embodiment

A sixth embodiment of the present invention will be described below. In the fifth embodiment, the second semiconductor layers are formed so that the thickness decreases in a direction of lamination. On the other hand, in the sixth embodiment, the second semiconductor layers are formed so that the lattice constant increases in a direction of lamination.

Figure 13:
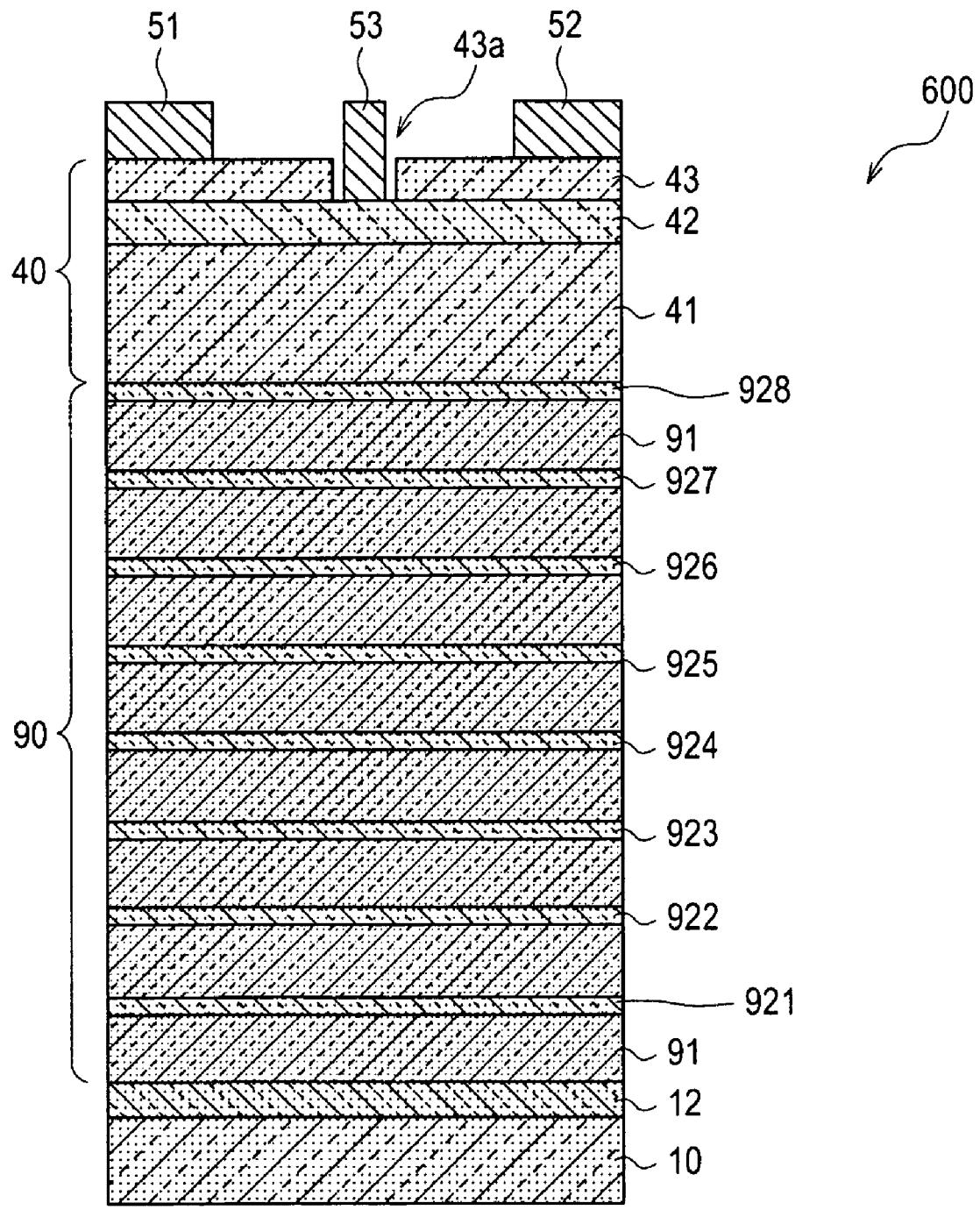
FIG. 13 is a cross sectional view schematically showing a field effect transistor according to a sixth embodiment of the present invention.

FIG. 13 is a cross sectional view schematically showing a field effect transistor according to a sixth embodiment. The field effect transistor 600 includes a substrate 10, an intermediate layer 12, a semiconductor active layer 40 in which an electron drift layer 41, an electron supplying layer 42, and a contact layer 43 are sequentially formed, a source electrode 51, a drain electrode 52, and a gate electrode 53, which are similar to those in the first embodiment. The field effect transistor 600 has a buffer layer 90 instead of the buffer layer 20 of the first embodiment.

The buffer layer 90 is a layered structure in which first semiconductor layers 91, . . . , 91 formed of undoped GaN and a second semiconductor layer 921, . . . , 928 formed of undoped $Al_xGa_{1-x}N$ ($0 < x \leq 1$) are alternately formed. A pair of a first semiconductor layer and a neighboring second semiconductor layer being considered as one composite layer, the buffer layer 90 includes eight composite layers.

The first semiconductor layers 91, . . . , 91 all have a thickness of 300 nm. On the other hand, the second semiconductor layers 921, . . . , 928 all have a thickness of 30 nm. Accordingly, the thickness of the buffer layer 90 is 2.68 µm. The aluminum composition (x) of the second semiconductor layers 921, . . . , 928 decreases in a direction of lamination, i.e., the lattice constant increases in a direction of lamination. That is, the aluminum composition (x) of the second semiconductor layer 921 is 1.0, which corresponds to a lattice constant of 0.3112 nm. The aluminum composition x of the second semiconductor layers decreases in a direction of lamination by a step of 0.07, and the aluminum composition (x) of the second semiconductor layer 928 is 0.51, which corresponds to a lattice constant of 0.315 nm. Lattice constants of such a mixed phase can be estimated based on lattice constants of AlN and GaN by using the Vegard's law.

Because the second semiconductor layers 921, . . . , 928 of the buffer layer 90 are formed such that the lattice constants thereof increase in a direction of lamination, the field effect transistor 600 has a high breakdown voltage and small warp. That is, in the field effect transistor 600, the lattice constant of the second semiconductor layers 921, . . . increases in a direction of lamination. Therefore, a difference in the lattice constant between the second semiconductor layer and the first semiconductor layer 91 decreases accordingly. As a result, when the first semiconductor layers 91, . . . are formed with the second semiconductor layers 921, . . . interposed therebetween, an effect similar to that of total layer thickness of the foundation layer by which the first semiconductor layer is affected being restrained from growing large is obtained, whereby the critical thickness is restrained from growing large. Therefore, the thickness of the first semiconductor layer can be larger than the critical thickness even for the first semiconductor layer 91 distant from the substrate 10. Accordingly, a generation of warp in the convex direction during epitaxial growth is restrained.

In the present sixth embodiment, the critical thickness is about 250 nm for the first semiconductor layer 91 located at eighth position as counted from the substrate 10. Therefore, a generation of warp in the convex direction during epitaxial growth is restrained in every first semiconductor layers 91. As a result, in the sixth embodiment also, it is possible to increase a number of composite layers in the buffer layer 90 while restraining the warp of the epitaxial wafer. Accordingly, the field effect transistor 600 has a high breakdown voltage and small warp.

Other preferred modified examples of the buffer layer will be described below. Unless otherwise specified, a material of the first semiconductor layer, and a material and layer thicknesses of the second semiconductor layer in the buffer layers to be described below are similar to those of the first embodiment.

First Modified Example

Figure 14:
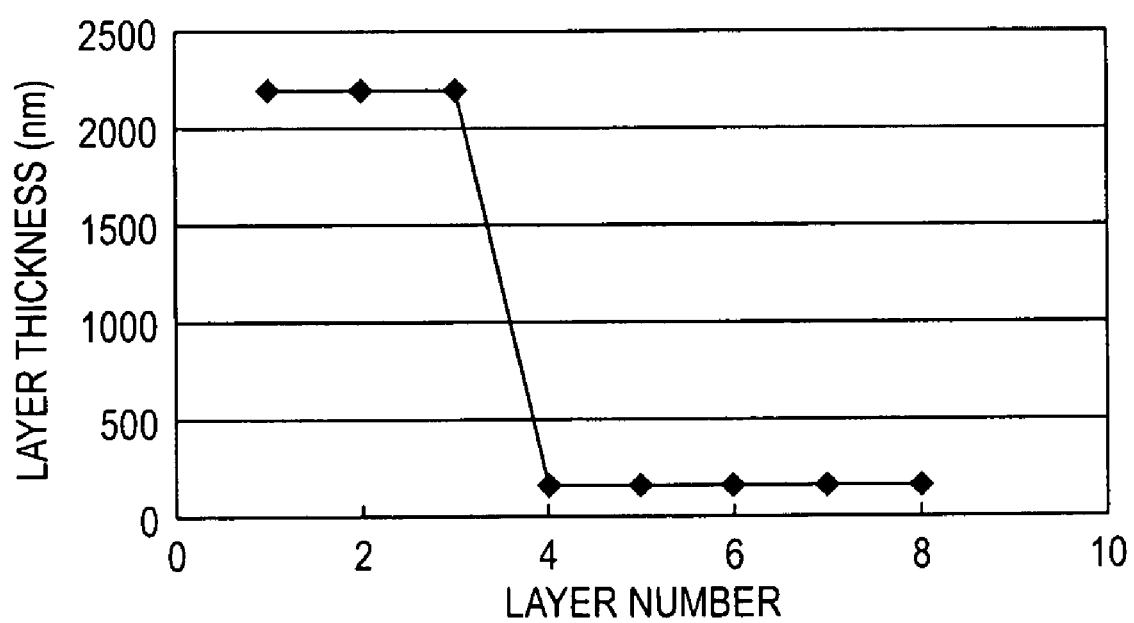
FIG. 14 is a graph showing a relationship between a layer number of a first semiconductor layer and a layer thickness in a first modified example.

FIG. 14 is a graph showing a relationship between a layer number of a first semiconductor layer and a layer thickness in a first modified example. As shown in FIG. 14, in the first modified example, the buffer layer includes eight composite layers. The thicknesses of the first semiconductor layers are, 2200 nm for lower layers of first to third layers as counted from the substrate, and 140 nm for fourth to eighth layers. Therefore, the thickness of the buffer layer is 7.30 µm. In addition, a total layer thickness of the epitaxial layer including the semiconductor active layer and the buffer layer is 8.65 µm.

Figure 15:
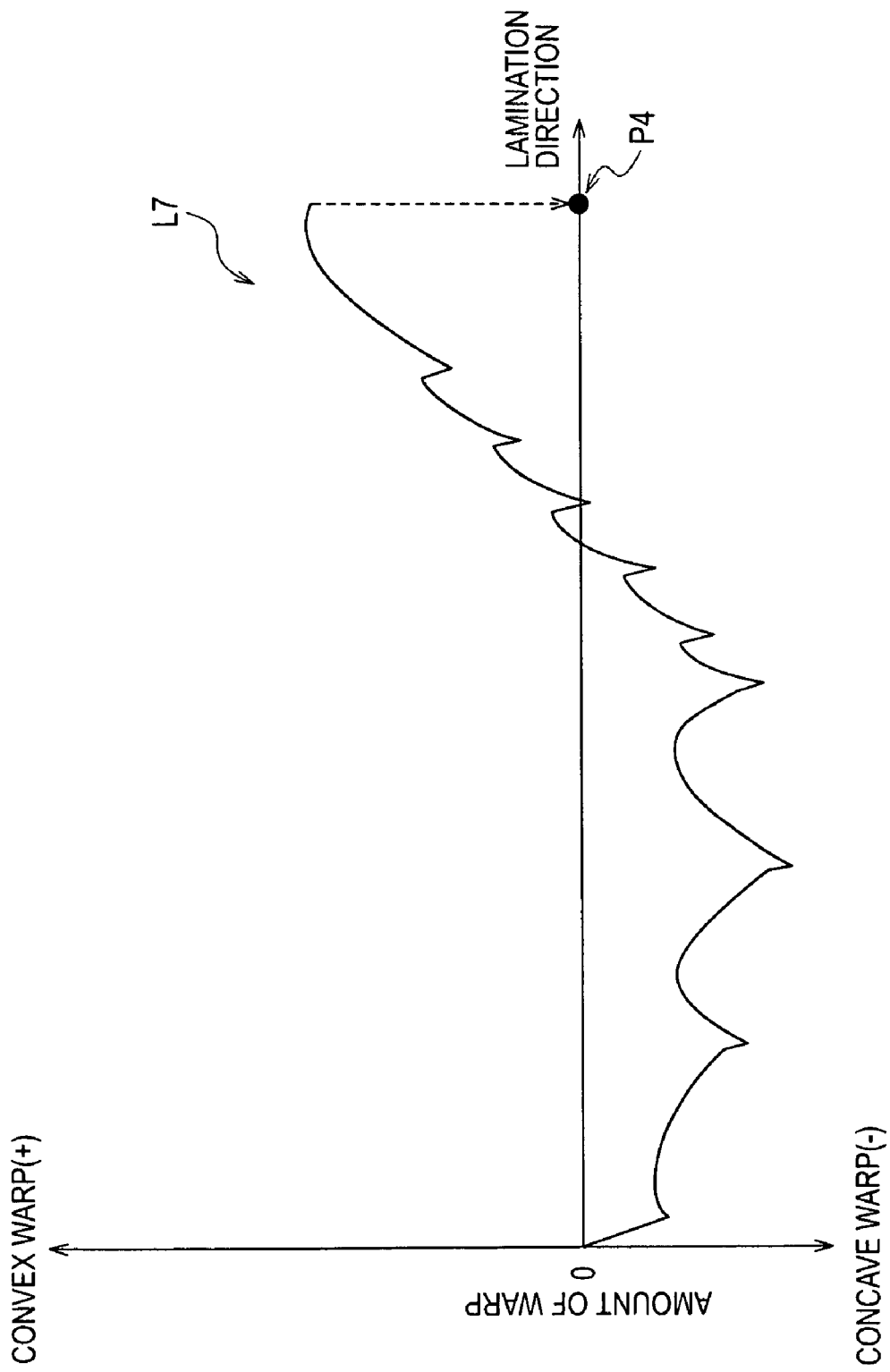
FIG. 15 is an explanatory diagram showing a direction and an amount of warp of an epitaxial wafer when forming each layer of a buffer layer on a substrate as shown in FIG. 14.

FIG. 15 is an explanatory diagram showing a direction and an amount of warp of an epitaxial wafer when forming each layer of the buffer layer on a substrate. The line L7 represents an amount of warp during epitaxial growth. As shown in FIG. 15, in the buffer layer according to the first modified example, the first semiconductor layers near the substrate, a critical thickness of which is small, are set thick to generate a warp in a concave direction as much as possible, while the first semiconductor layers a critical thickness of which is large and which are unapt to generate a warp in the concave direction are set thin to restrain a generation of warp in the convex direction. As a result, an amount of warp in the aggregate becomes small as designated by the point P4. Accordingly, with the buffer layer according to the first modified example, the field effect transistor has a high breakdown voltage and small warp.

In the buffer layer according to the first modified example, the critical thicknesses for the first semiconductor layers located at first to third positions as counted from the substrate were confirmed to be about 200 nm, 600 nm, and 1600 nm, respectively. That is, the thickness of these first semiconductor layers are sufficiently greater than the respective critical thicknesses. Therefore, a sufficient amount of warp in the concave direction is generated.

Further, in order to generate a warp in the concave direction as much as possible in the first semiconductor layers near the substrate, it is preferable that the first semiconductor layers having a thickness greater than the critical thickness is located at a portion lower than one third of the number of the composite layers of the buffer layer.

Second Modified Example

Figure 16:
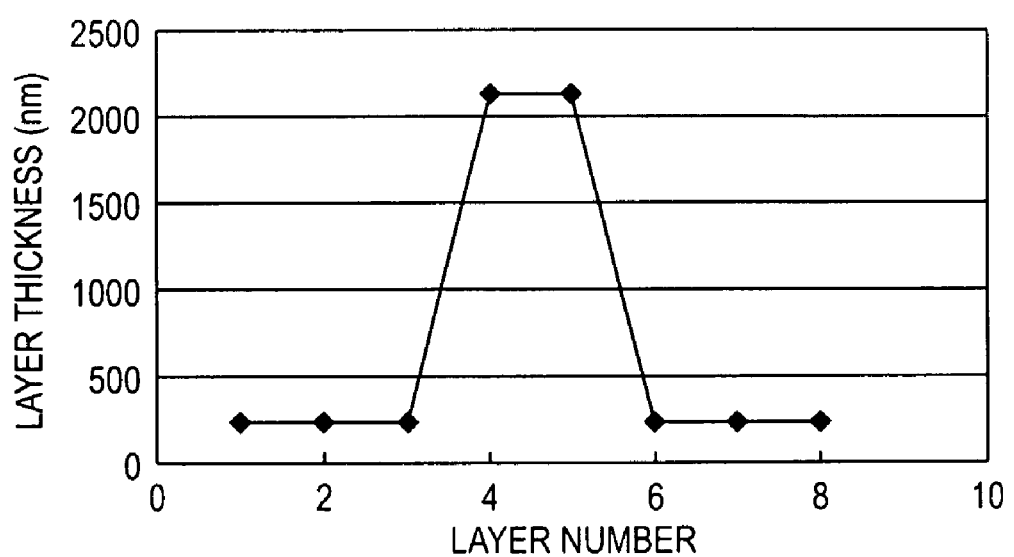
FIG. 16 is a graph showing a relationship between a layer number of a first semiconductor layer and a layer thickness in a second modified example.

FIG. 16 is a graph showing a relationship between a layer number of a first semiconductor layer and a layer thickness in a second modified example. As shown in FIG. 16, in the second modified example, the buffer layer includes eight composite layers. The thicknesses of the first semiconductor layers are, 240 nm for lower layers of first to third layers as counted from the substrate, 2140 nm for middle layers of fourth and fifth layers, and 240 nm for upper layers of sixth to eighth layers. Therefore, the thickness of the buffer layer is 6.20 μm. In addition, a total layer thickness of the epitaxial layer including the semiconductor active layer and the buffer layer is 7.55 μm.

Figure 17:
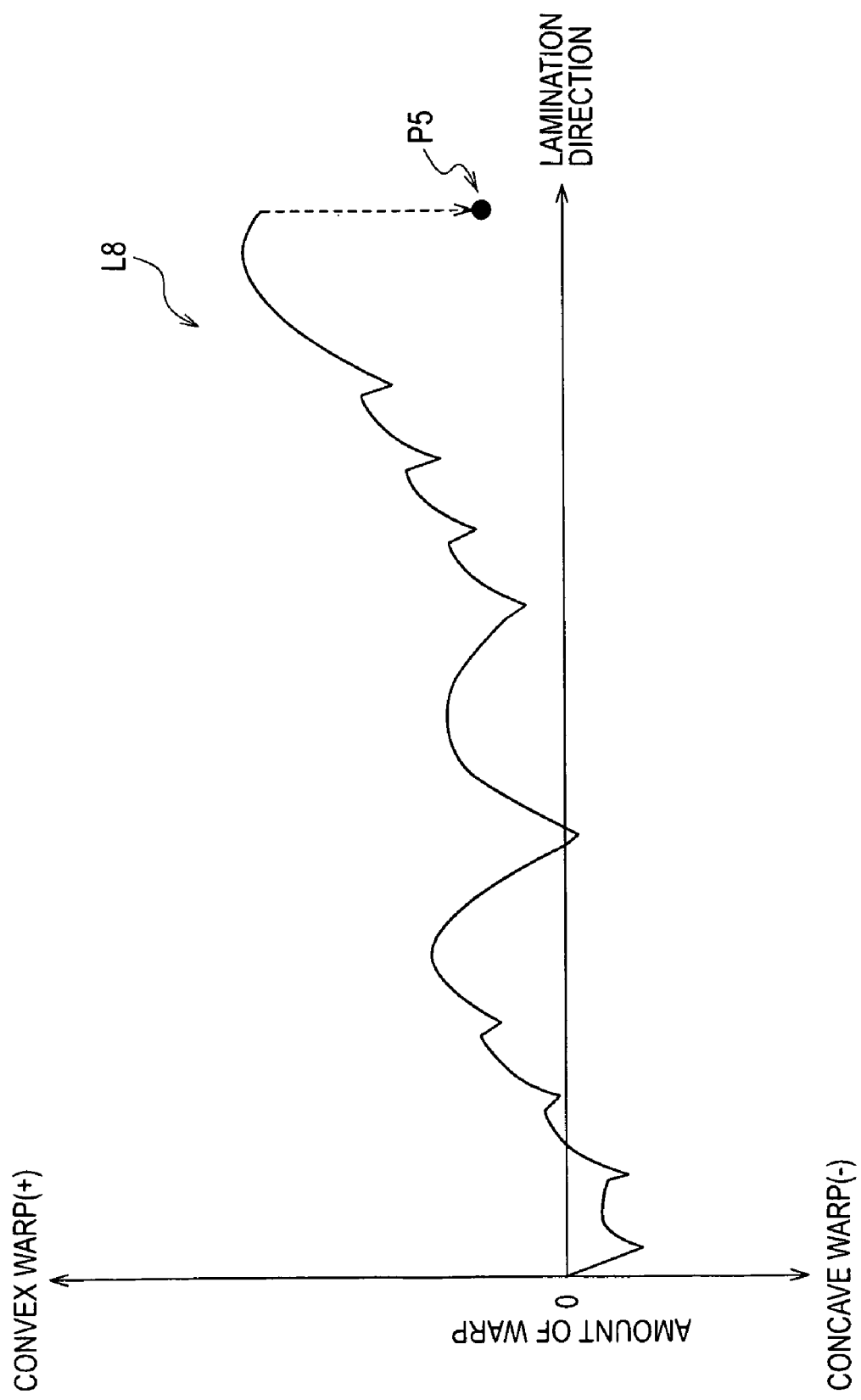
FIG. 17 is an explanatory diagram showing a direction and an amount of warp of an epitaxial wafer when forming each layer of a buffer layer on a substrate as shown in FIG. 16.

FIG. 17 is an explanatory diagram showing a direction and an amount of warp of an epitaxial wafer when forming each layer of a buffer layer on a substrate. The line L8 represents an amount of warp during epitaxial growth. As shown in FIG. 17, in the buffer layer according to the second modified example, the first semiconductor layers near the substrate are set thin to restrain a generation of warp in a convex direction, the first semiconductor layers in the middle layers are set thick to generate a large amount of warp in the concave direction, and the upper first semiconductor layers, a critical thickness of which is large and which are unapt to generate a warp in the concave direction, are set thin to restrain a generation of warp in the convex direction. As a result, an amount of warp in the aggregate becomes small as designated by the point P5. Accordingly, with the buffer layer according to the second modified example, the field effect transistor has a high breakdown voltage and small warp.

In the buffer layer according to the second modified example, the critical thicknesses for the first semiconductor layers located at fourth and fifth positions as counted from the substrate were confirmed to be about 300 nm and 700 nm, respectively. That is, the thicknesses of these first semiconductor layers are sufficiently greater than the respective critical thicknesses. Therefore, a sufficient amount of warp in the concave direction is generated.

Further, in order to restrain a warp in the convex direction in the first semiconductor layers near the substrate and restrain a warp in the convex direction in the upper layers, it is preferable that the first semiconductor layers having a thickness greater than the critical thickness is located between one third and two thirds of the number of the composite layers of the buffer layer.

Third Modified Example

Figure 18:
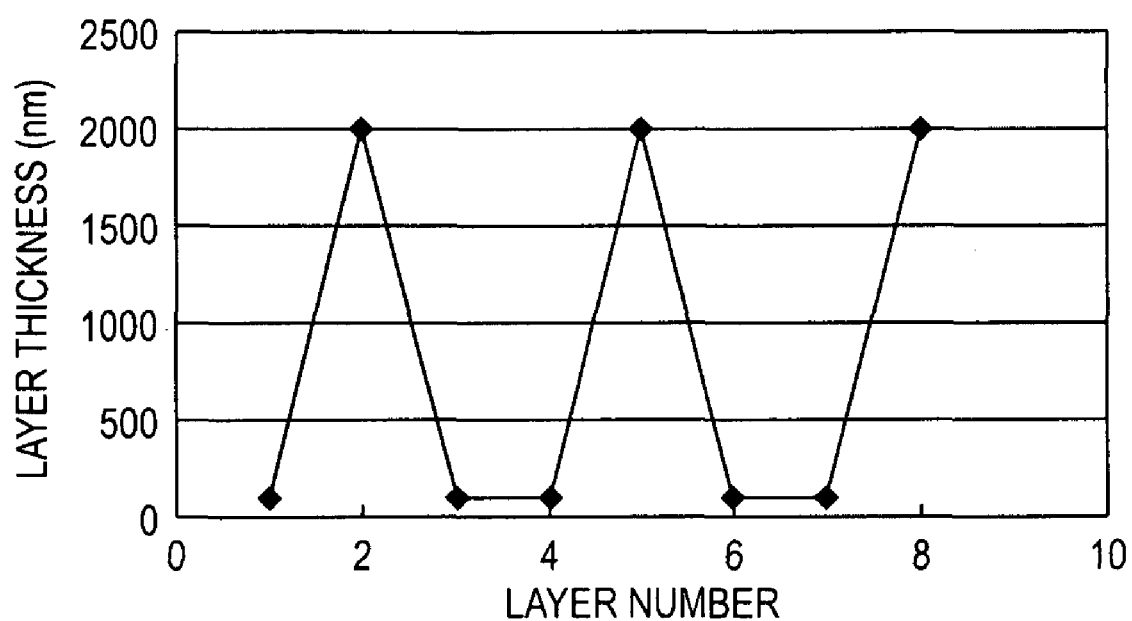
FIG. 18 is a graph showing a relationship between a layer number of a first semiconductor layer and a layer thickness in a third modified example.

FIG. 18 is a graph showing a relationship between a layer number of a first semiconductor layer and a layer thickness in a third modified example. As shown in FIG. 18, in the third modified example, the buffer layer includes eight composite layers. The thicknesses of the first semiconductor layers are, 2000 nm for second, fifth, and eighth layers as counted from the substrate, and 90 nm for the other layers. That is, first semiconductor layers having thicknesses greater than respective critical thicknesses are formed in the lower, middle, and upper layers of the buffer layer. The thickness of the buffer layer is 6.45 μm. In addition, a total layer thickness of the epitaxial layer including the semiconductor active layer and the buffer layer is 7.80 μm.

Figure 19:
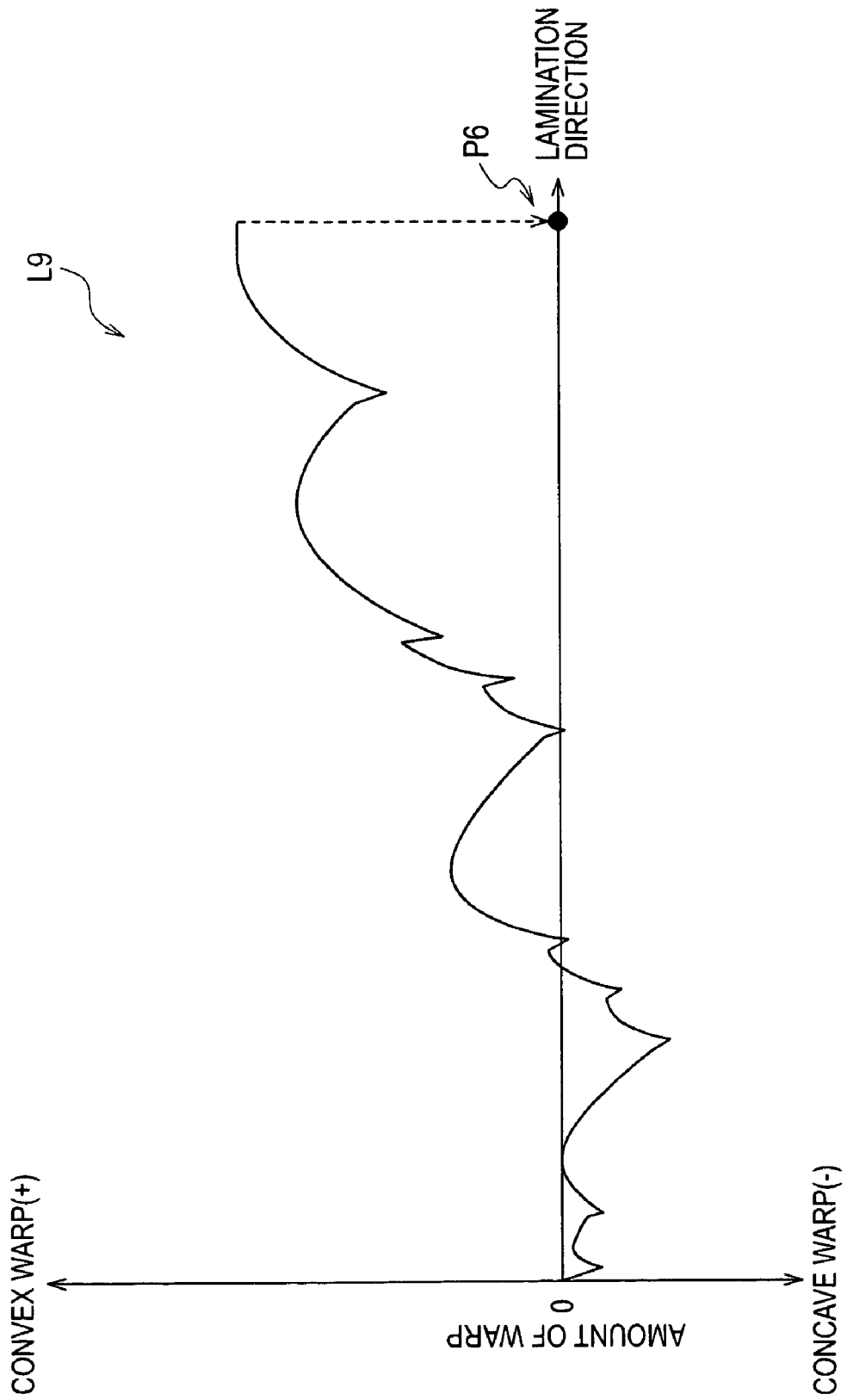
FIG. 19 is an explanatory diagram showing a direction and an amount of warp of an epitaxial wafer when forming each layer of a buffer layer on a substrate as shown in FIG. 18.

FIG. 19 is an explanatory diagram showing a direction and an amount of warp of an epitaxial wafer when forming each layer of a buffer layer on a substrate. The line L9 represents an amount of warp during epitaxial growth. As shown in FIG. 19, in the buffer layer according to the third modified example also, an amount of warp in the aggregate becomes small as designated by the point P6. Accordingly, with the buffer layer according to the third modified example, the field effect transistor has a high breakdown voltage and small warp.

In the third modified example, the critical thickness becomes the greatest for the first semiconductor layer located at eighth position as counted from the substrate, which is about 1600 nm. The thickness of the first semiconductor layer is 2000 nm and sufficiently greater than the critical thickness. Accordingly, a sufficient amount of warp in the concave direction occurs. In addition, a still larger amount of warp in the concave direction occurs also in the first semiconductor layers located at second and fifth positions as counted from the substrate, which have a thickness equal to the first semiconductor layer located at eighth position.

Fourth Modified Example

Figure 20:
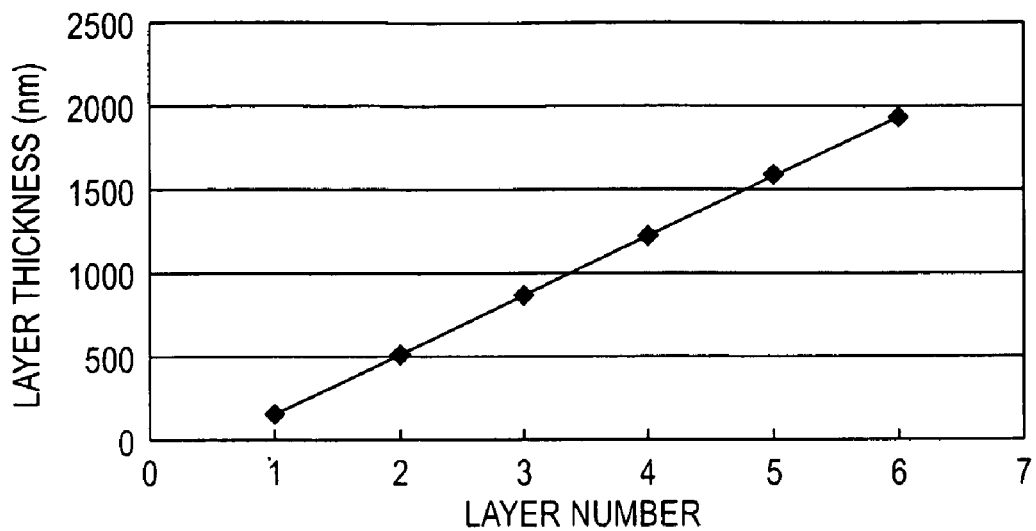
FIG. 20 is a graph showing a relationship between a layer number of a first semiconductor layer and a layer thickness in a fourth modified example.

FIG. 20 is a graph showing a relationship between a layer number of a first semiconductor layer and a layer thickness in a fourth modified example. As shown in FIG. 20, in the fourth modified example, the buffer layer includes six composite layers. The thickness of the first semiconductor layer is 186 nm for a first semiconductor layer located at first position as counted from the substrate. The thickness of the first semiconductor layers increases in a direction of lamination by a step of 350 nm, and is 1936 nm for a first semiconductor layer located at sixth position as counted from the substrate. The second semiconductor layers all are 64 nm in thickness. Therefore, the thickness of the buffer layer is 6.75 μm. Further, in the fourth modified example, the first semiconductor layers located at second to sixth positions as counted from the substrate have thicknesses greater than respective critical thicknesses. Accordingly, with the buffer layer according to the fourth modified example, the field effect transistor has a high breakdown voltage and small warp.

Fifth Modified Example

Figure 21:
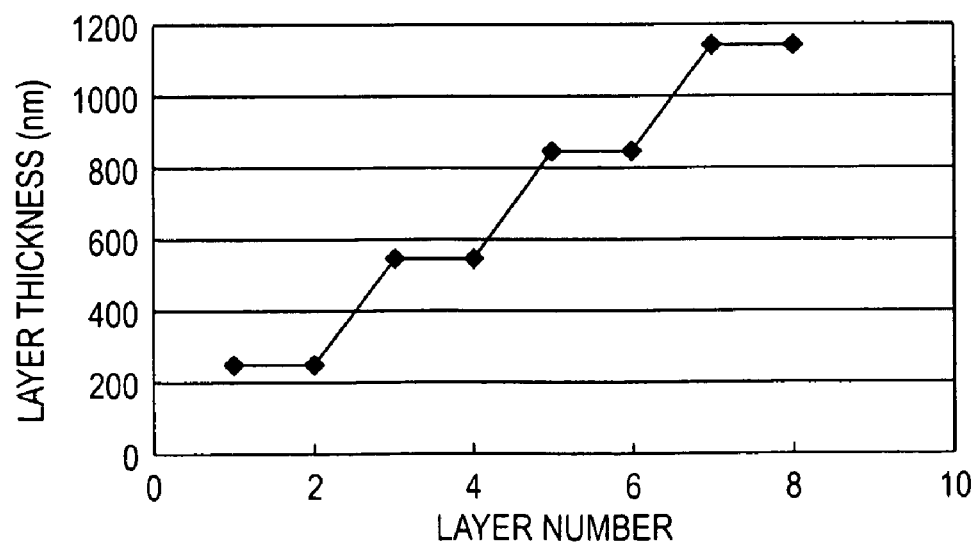
FIG. 21 is a graph showing a relationship between a layer number of a first semiconductor layer and a layer thickness in a fifth modified example.

FIG. 21 is a graph showing a relationship between a layer number of a first semiconductor layer and a layer thickness in a fifth modified example. As shown in FIG. 21, in the fifth modified example, the buffer layer includes eight composite layers. The thickness of the first semiconductor layer is 240 nm for a first semiconductor layer located at first position as counted from the substrate. The thickness of the first semiconductor layers increases in a direction of lamination in a stepwise manner by a step of 300 nm for every two layers, and is 1140 nm for a first semiconductor layer located at eighth position as counted from the substrate. Therefore, the thickness of the buffer layer is 6.0 μm. Further, in the fifth modified example, the first semiconductor layers located at first and third to seventh positions as counted from the substrate have thicknesses greater than respective critical thicknesses. Accordingly, with the buffer layer according to the fifth modified example, the field effect transistor has a high breakdown voltage and small warp.

Sixth Modified Example

Figure 22:
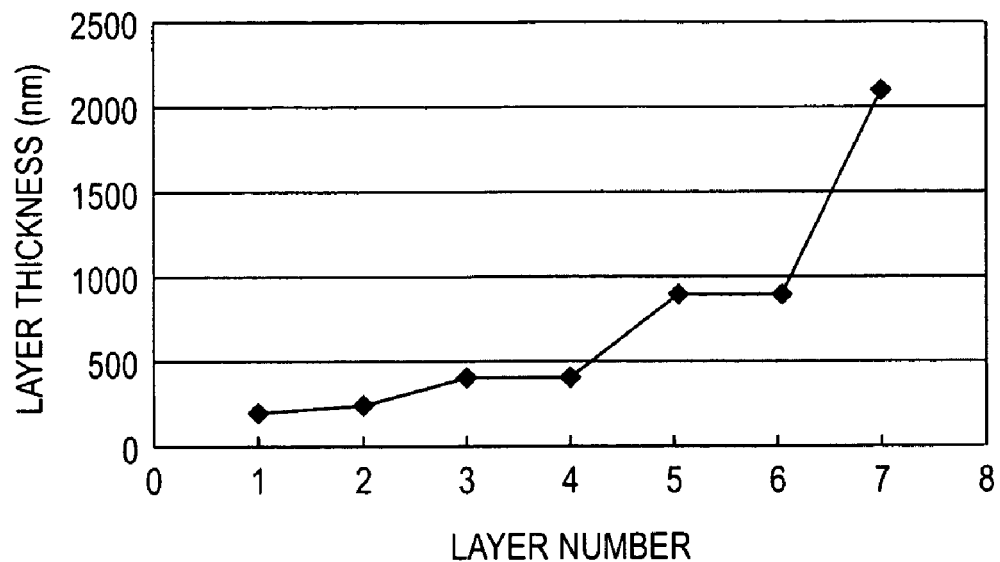
FIG. 22 is a graph showing a relationship between a layer number of a first semiconductor layer and a layer thickness in a sixth modified example.

FIG. 22 is a graph showing a relationship between a layer number of a first semiconductor layer and a layer thickness in a sixth modified example. As shown in FIG. 22, in the sixth modified example, the buffer layer includes seven composite layers. The thickness of the first semiconductor layer is 140 nm for a first semiconductor layer located at first position as counted from the substrate. The thickness of the first semiconductor layers increases in a direction of lamination in an irregularly stepwise manner, and is 2040 nm for a first semiconductor layer located at seventh position as counted from the substrate. The thickness of the buffer layer is 5.15 µm. Further, in the sixth modified example, the first semiconductor layers located at third to seventh positions as counted from the substrate have thicknesses greater than respective critical thicknesses. Accordingly, with the buffer layer according to the sixth modified example, the field effect transistor has a high breakdown voltage and small warp.

Seventh Modified Example

Figure 23:
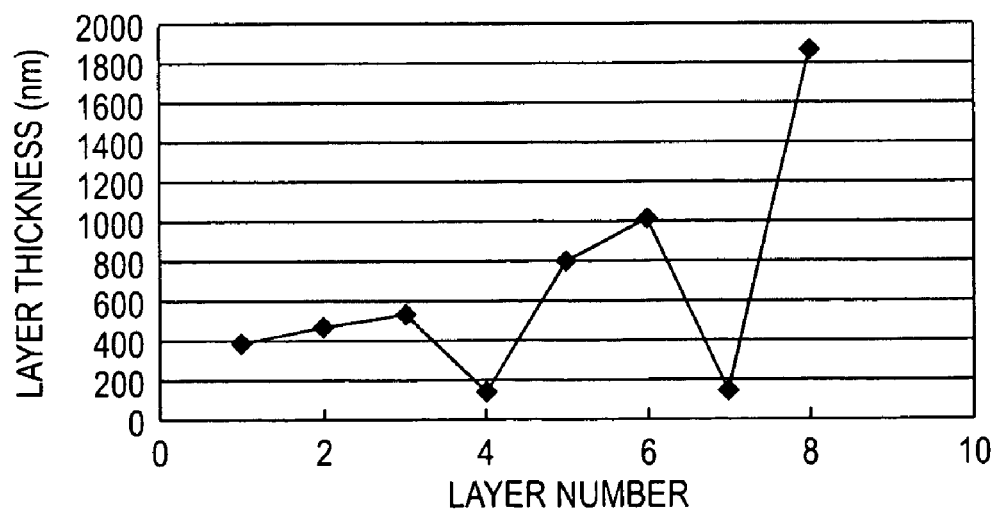
FIG. 23 is a graph showing a relationship between a layer number of a first semiconductor layer and a layer thickness in a seventh modified example.
Figure 24:
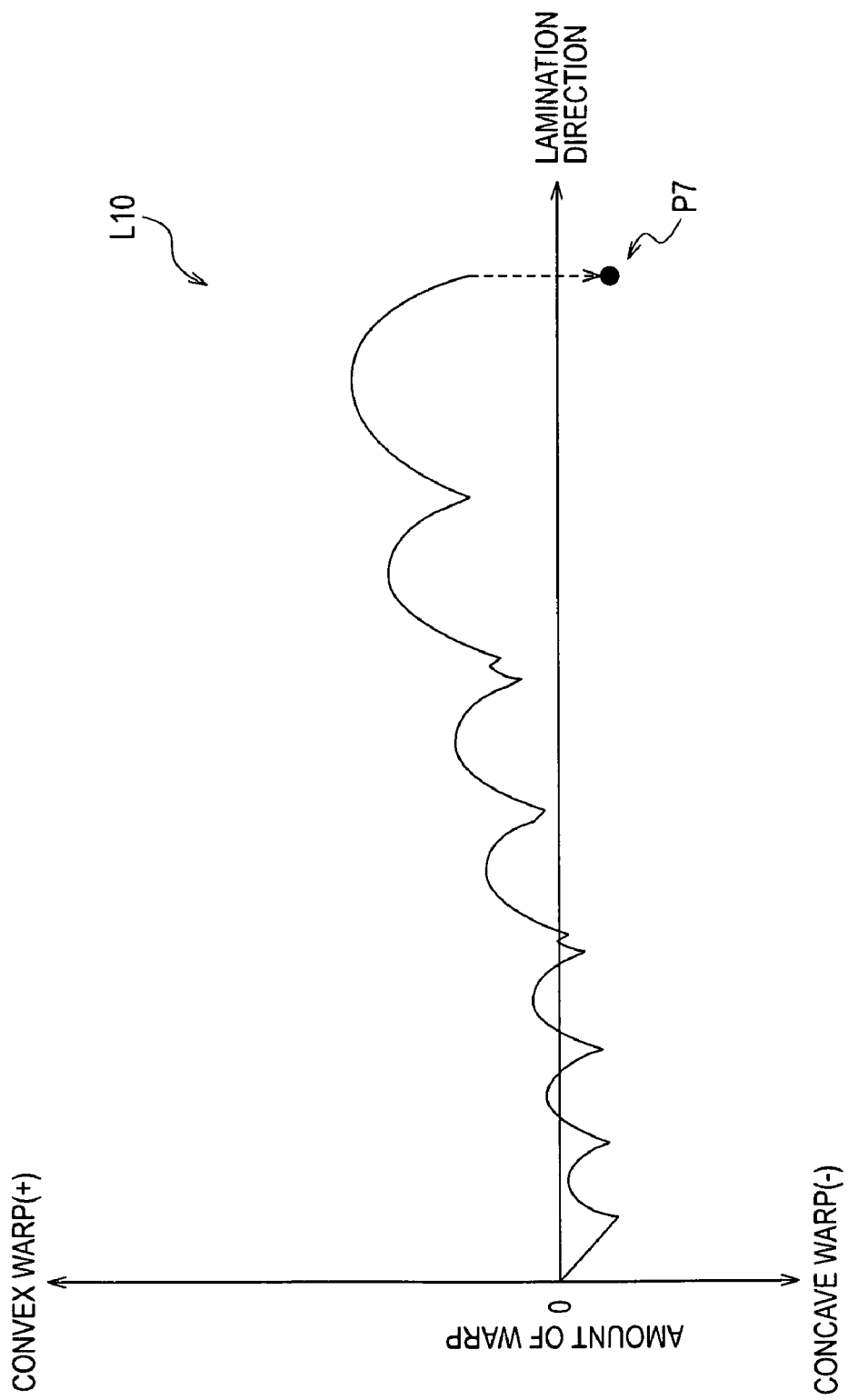
FIG. 24 is an explanatory diagram showing a direction and an amount of warp of an epitaxial wafer when forming each layer of a buffer layer on a substrate as shown in FIG. 23.

FIG. 23 is a graph showing a relationship between a layer number of a first semiconductor layer and a layer thickness in a seventh modified example. Further, FIG. 24 is an explanatory diagram showing a direction and an amount of warp of an epitaxial wafer when forming each layer of a buffer layer on a substrate. The line L10 represents an amount of warp during epitaxial growth. As shown in FIG. 23 and FIG. 24, in the seventh modified example, the buffer layer includes eight composite layers. The thickness of the first semiconductor layer is 385 nm for a first semiconductor layer located at first position as counted from the substrate. The thickness of the first semiconductor layers increases in a direction of lamination in an irregular manner, and at the fourth and seventh positions, thin first semiconductor layers are formed to fine-adjust the warp. The thickness of the first semiconductor layer located at eighth position as counted from the substrate is 1872 nm. The thickness of the buffer layer is 5.85 µm. Further, in the seventh modified example, the first semiconductor layers located at first to third, fifth, sixth, and eighth positions as counted from the substrate have thicknesses greater than respective critical thicknesses. Accordingly, with the buffer layer according to the seventh modified example, the field effect transistor has a high breakdown voltage, and the warp is small as designated by the point P7 in FIG. 24.

Eight Modified Example

Figure 25:
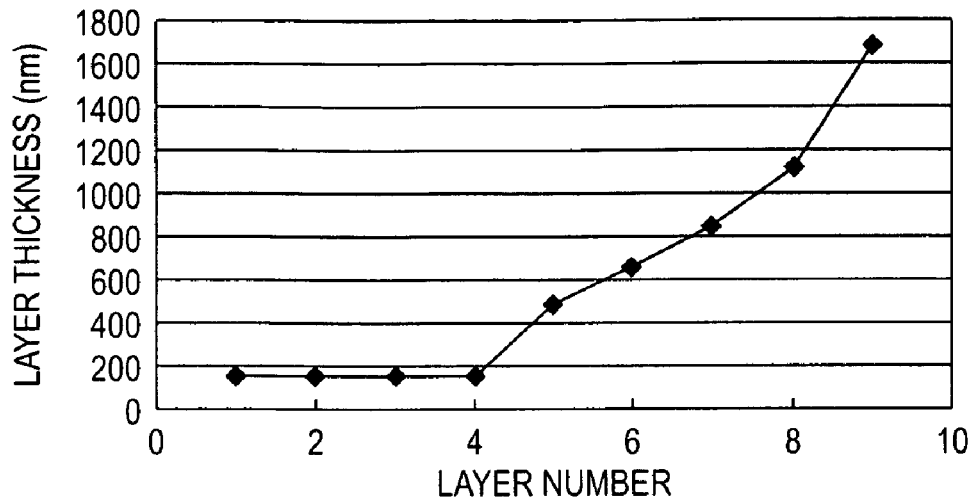
FIG. 25 is a graph showing a relationship between a layer number of a first semiconductor layer and a layer thickness in an eighth modified example.

FIG. 25 is a graph showing a relationship between a layer number of a first semiconductor layer and a layer thickness in an eighth modified example. As shown in FIG. 25, in the eighth modified example, the buffer layer includes nine composite layers. The thickness of the first semiconductor layer is 140 nm for first semiconductor layers located at first to fourth positions as counted from the substrate. In the upper layers, the thickness of the first semiconductor layers increases in a direction of lamination, and is 1696 nm for a first semiconductor layer located at ninth position as counted from the substrate. The thickness of the buffer layer is 5.85 µm. Further, in the eighth modified example, the first semiconductor layers located at fifth to ninth positions as counted from the substrate have thicknesses greater than respective critical thicknesses. Accordingly, with the buffer layer according to the eighth modified example, the field effect transistor has a high breakdown voltage and small warp.

Ninth Modified Example

Figure 26:
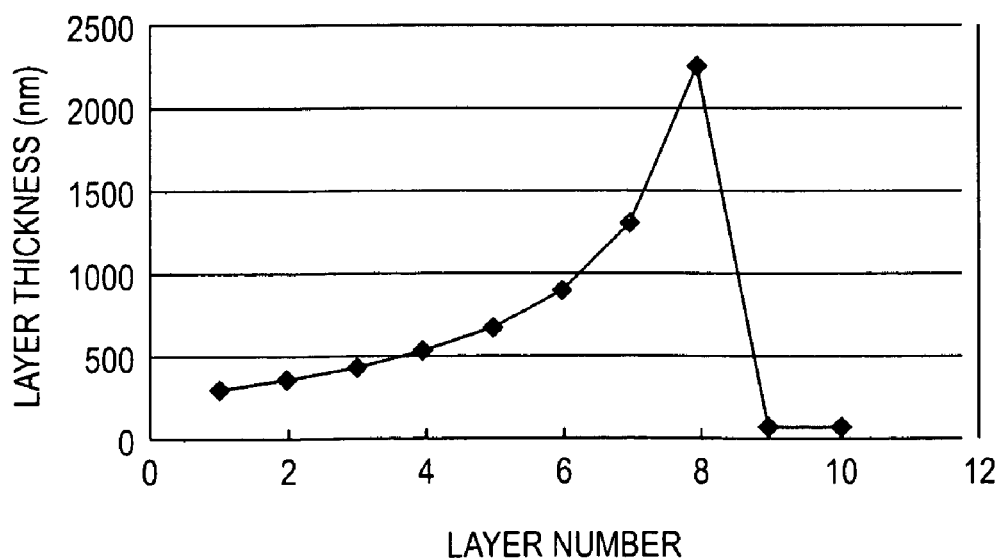
FIG. 26 is a graph showing a relationship between a layer number of a first semiconductor layer and a layer thickness in a ninth modified example.
Figure 27:
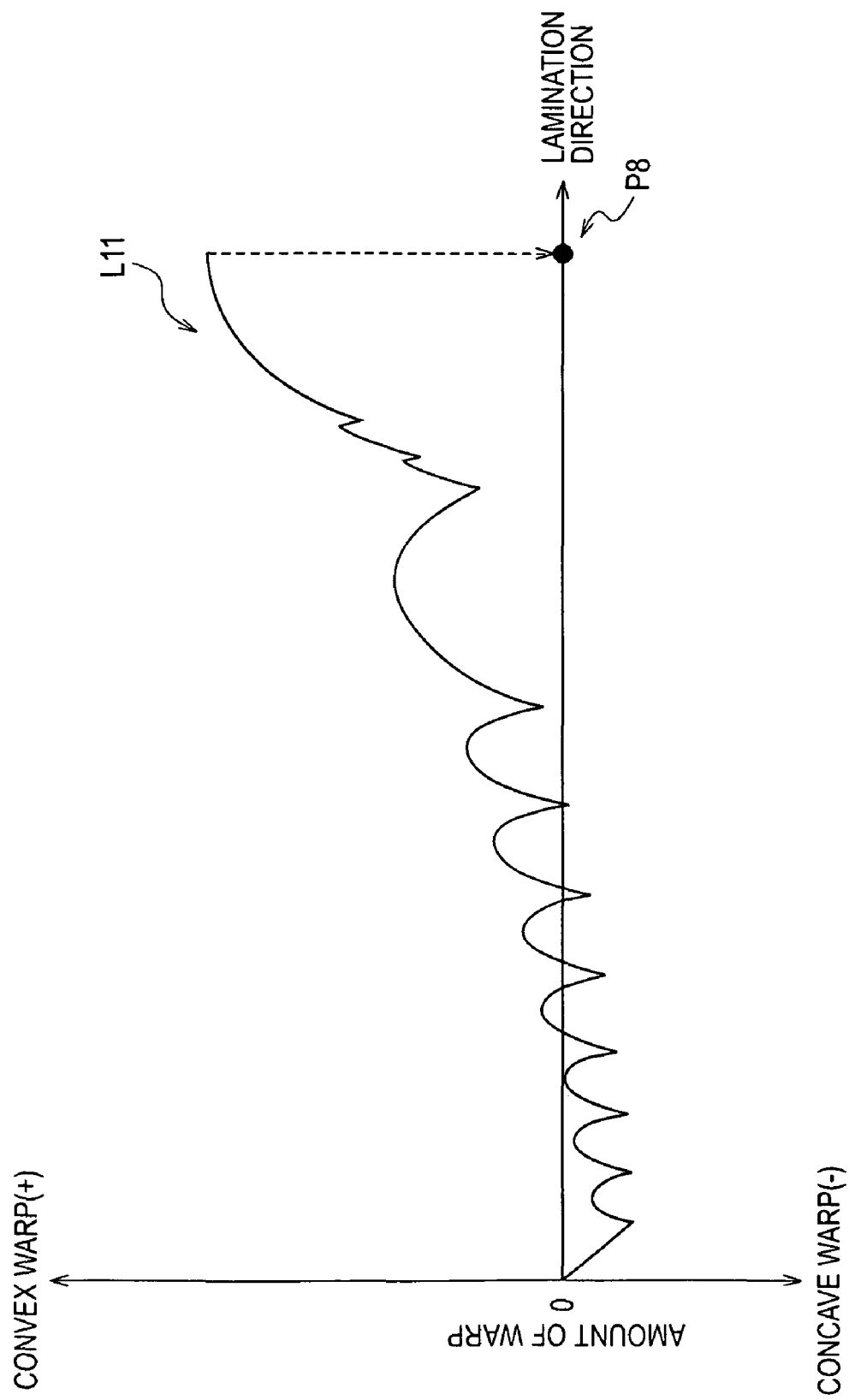
FIG. 27 is an explanatory diagram showing a direction and an amount of warp of an epitaxial wafer when forming each layer of a buffer layer on a substrate as shown in FIG. 26.

FIG. 26 is a graph showing a relationship between a layer number of a first semiconductor layer and a layer thickness in a ninth modified example. Further, FIG. 27 is an explanatory diagram showing a direction and an amount of warp of an epitaxial wafer when forming each layer of a buffer layer on a substrate. The line L11 represents an amount of warp during epitaxial growth. As shown in FIG. 26 and FIG. 27, in the ninth modified example, the buffer layer includes ten composite layers. The thickness of the first semiconductor layer is 300 nm for a first semiconductor layer located at first position as counted from the substrate. The thickness of the first semiconductor layers increases in a direction of lamination until the first semiconductor layer located at eighth position which is 2238 nm in thickness. Thereafter, the thickness drops to 50 nm for the first semiconductor layers located at ninth and tenth positions. The thickness of the buffer layer is 7.40 µm. Further, in the ninth modified example, the first semiconductor layers located at first to eighth positions as counted from the substrate have thicknesses greater than respective critical thicknesses. Accordingly, with the buffer layer according to the ninth modified example, the field effect transistor has a high breakdown voltage, and the warp is small as designated by the point P8 in FIG. 27.

Tenth Modified Example

Figure 28:
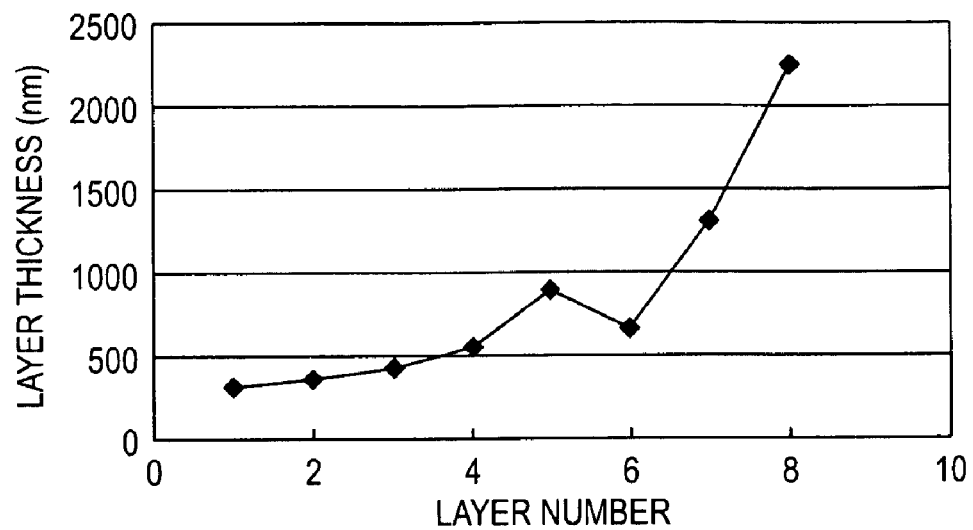
FIG. 28 is a graph showing a relationship between a layer number of a first semiconductor layer and a layer thickness in a tenth modified example.

FIG. 28 is a graph showing a relationship between a layer number of a first semiconductor layer and a layer thickness in a tenth modified example. As shown in FIG. 28, in the tenth modified example, the first semiconductor layers located at fifth and sixth positions of the buffer layer of the first embodiment are transposed. Accordingly, with the buffer layer according to the tenth modified example, the field effect transistor has a high breakdown voltage and small warp.

Eleventh Modified Example

Figure 29:
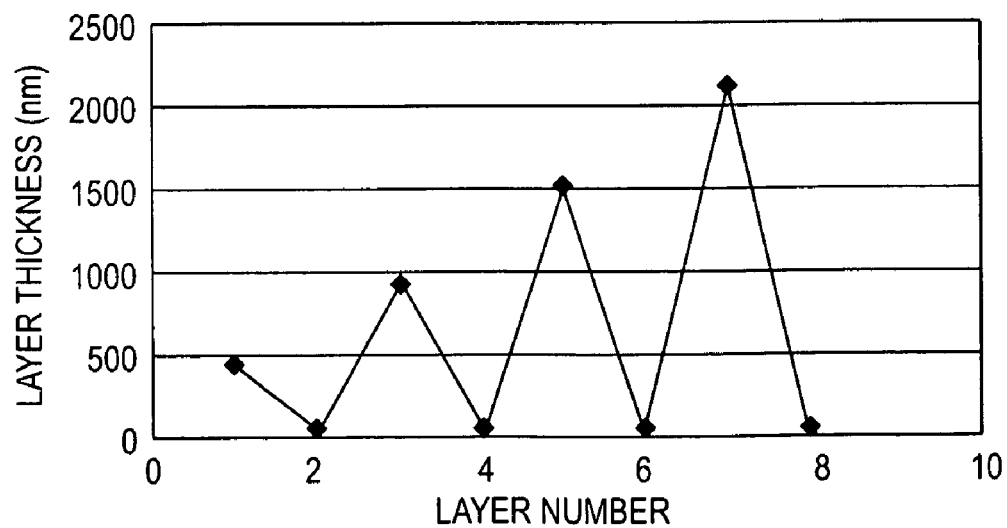
FIG. 29 is a graph showing a relationship between a layer number of a first semiconductor layer and a layer thickness in an eleventh modified example.
Figure 30:
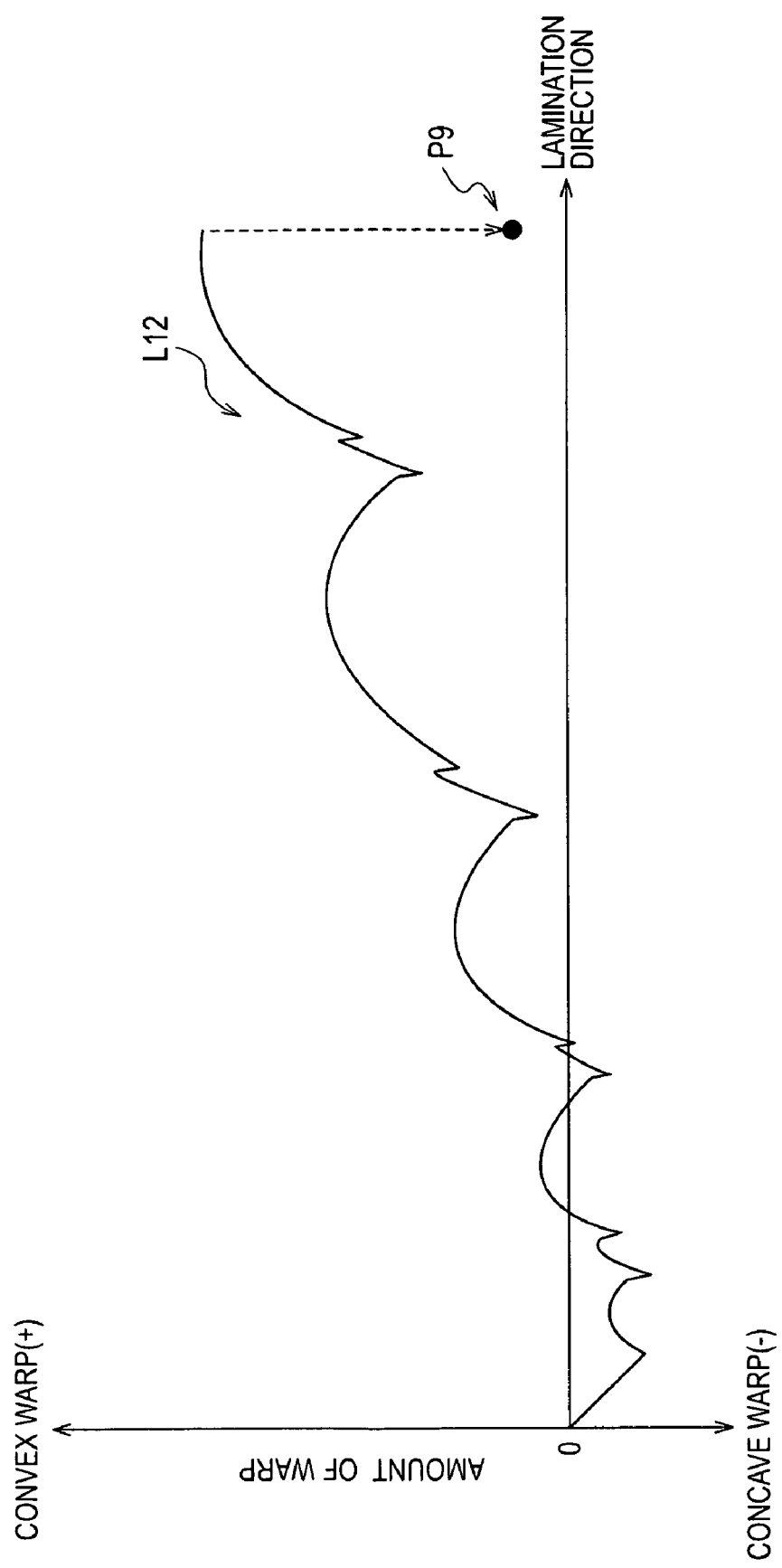
FIG. 30 is an explanatory diagram showing a direction and an amount of warp of an epitaxial wafer when forming each layer of a buffer layer on a substrate as shown in FIG. 29.

FIG. 29 is a graph showing a relationship between a layer number of a first semiconductor layer and a layer thickness in an eleventh modified example. Further, FIG. 30 is an explanatory diagram showing a direction and an amount of warp of an epitaxial wafer when forming each layer of a buffer layer on a substrate. The line L12 represents an amount of warp during epitaxial growth. As shown in FIG. 29 and FIG. 30, in the eleventh modified example, the buffer layer includes eight composite layers. The thickness of the first semiconductor layer is 440 nm for a first semiconductor layer located at first position as counted from the substrate. In the upper layers, the thickness of the first semiconductor layers changes zigzag in a direction of lamination to fine-adjust the warp, and the first semiconductor layer located at seventh position as counted from the substrate is 2140 nm in thickness. The thickness of the buffer layer is 5.74 µm. Further, in the eleventh modified example, the first semiconductor layers located at first, third, fifth, and seventh positions as counted from the substrate have thicknesses greater than respective critical thicknesses. Accordingly, with the buffer layer according to the eleventh modified example, the field effect transistor has a high breakdown voltage, and the warp is small as designated by the point P9 in FIG. 30.

Twelfth Modified Example

Figure 31:
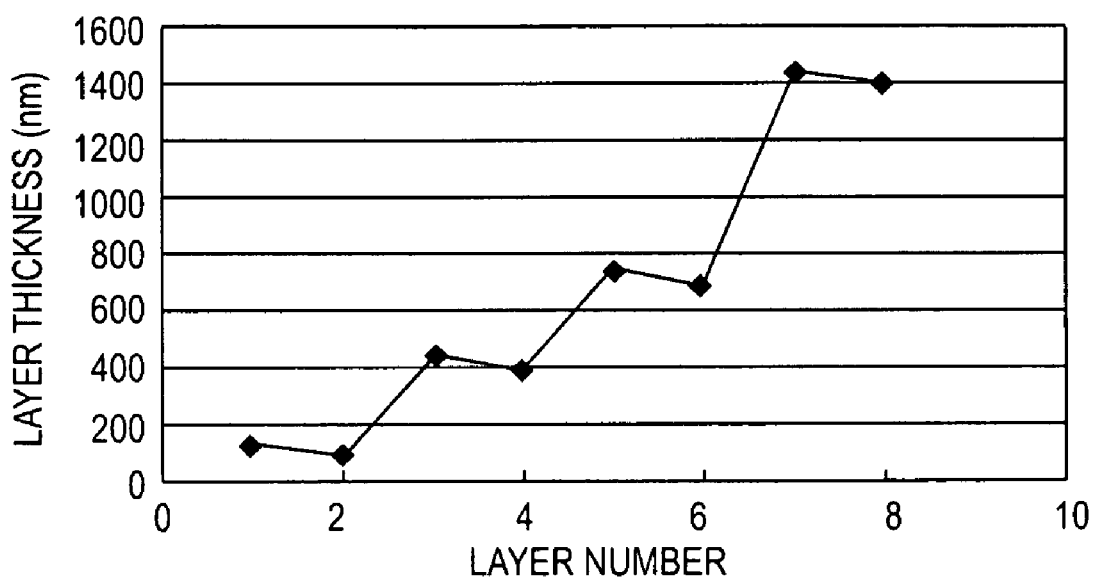
FIG. 31 is a graph showing a relationship between a layer number of a first semiconductor layer and a layer thickness in a twelfth modified example.
Figure 32:
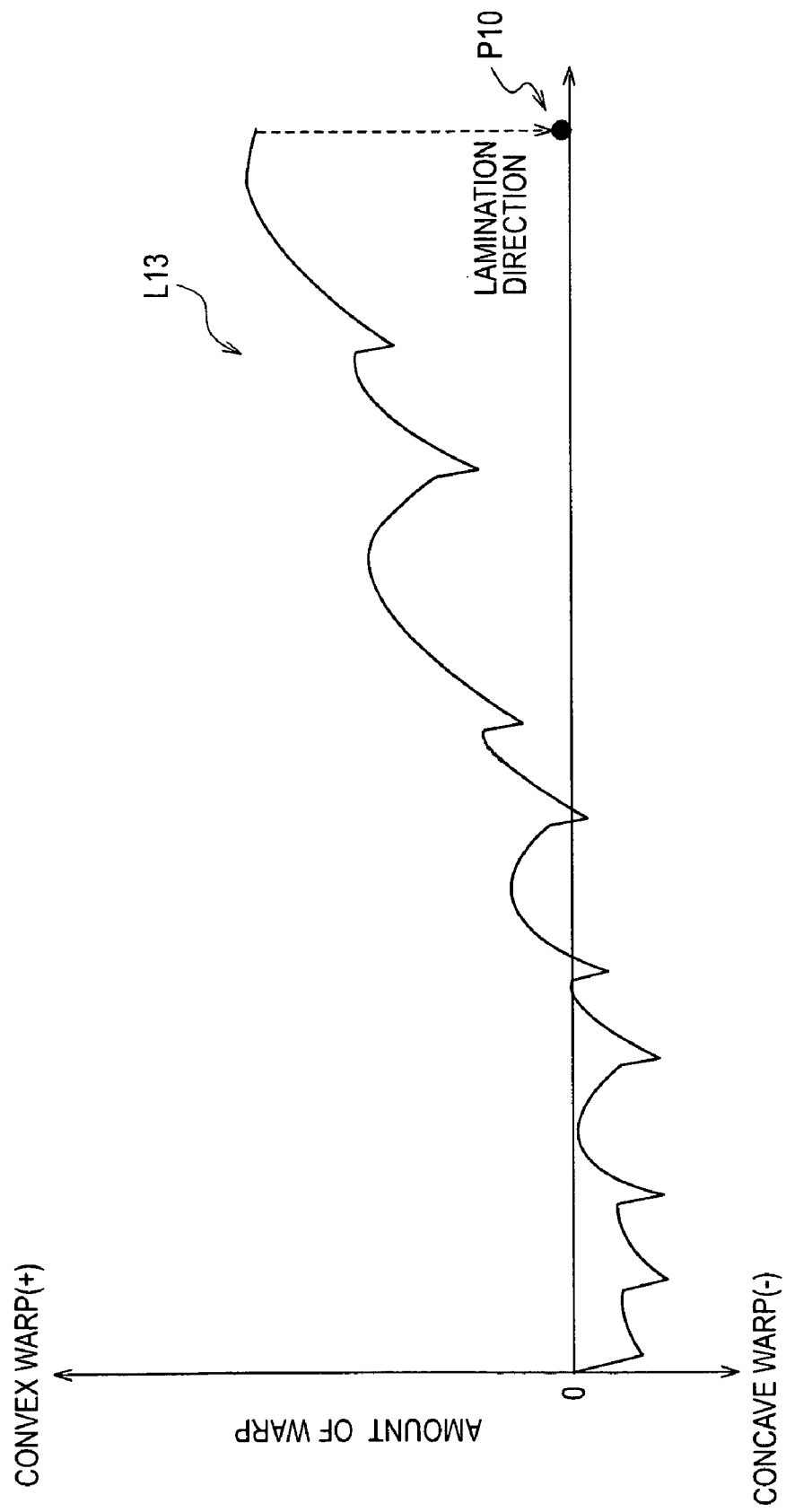
FIG. 32 is an explanatory diagram showing a direction and an amount of warp of an epitaxial wafer when forming each layer of a buffer layer on a substrate as shown in FIG. 31.

FIG. 31 is a graph showing a relationship between a layer number of a first semiconductor layer and a layer thickness in a twelfth modified example. Further, FIG. 32 is an explanatory diagram showing a direction and an amount of warp of an epitaxial wafer when forming each layer of a buffer layer on a substrate. The line L13 represents an amount of warp during epitaxial growth. As shown in FIG. 31 and FIG. 32, in the twelfth modified example, the buffer layer includes eight composite layers. The thickness of the first semiconductor layer is 140 nm for a first semiconductor layer located at first position as counted from the substrate. In the upper layers, the thickness of the first semiconductor layers increases zigzag in a direction of lamination to fine-adjust the warp, and the first semiconductor layer located at seventh position as counted from the substrate is 1440 nm in thickness. The thickness of the buffer layer is 5.8 µm. Further, in the twelfth modified example, the first semiconductor layers located at third to seventh positions as counted from the substrate have thicknesses greater than respective critical thicknesses. Accordingly, with the buffer layer according to the twelfth modified example, the field effect transistor has a high breakdown voltage, and the warp is small as designated by the point P10 in FIG. 32.

Thirteenth Modified Example

Figure 33:
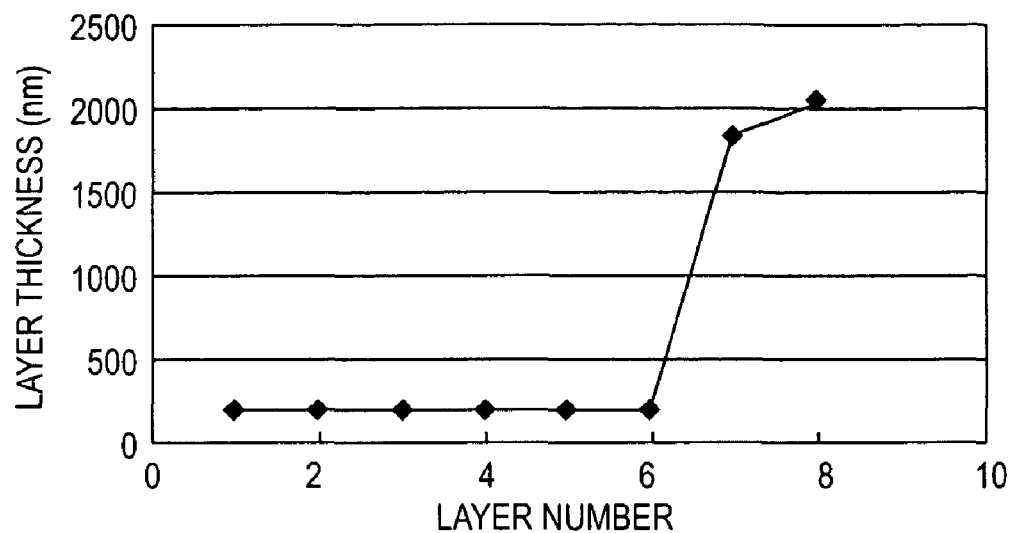
FIG. 33 is a graph showing a relationship between a layer number of a first semiconductor layer and a layer thickness in a thirteenth modified example.

FIG. 33 is a graph showing a relationship between a layer number of a first semiconductor layer and a layer thickness in an thirteenth modified example. As shown in FIG. 33, in the thirteenth modified example, the buffer layer includes eight composite layers. The thickness of the first semiconductor layers is 190 nm for first semiconductor layers located at first to sixth positions as counted from the substrate. In the upper layers, the thickness of the first semiconductor layers increases in a direction of lamination, and is 2040 nm for a first semiconductor layer located at eighth position as counted from the substrate. The thickness of the buffer layer is 5.5 µm. Further, in the thirteenth modified example, the first semiconductor layers located at seventh and eighth positions as counted from the substrate have thicknesses greater than respective critical thicknesses. Accordingly, with the buffer layer according to the thirteenth modified example, the field effect transistor has a high breakdown voltage and small warp.

Fourteenth Modified Example

Figure 34:
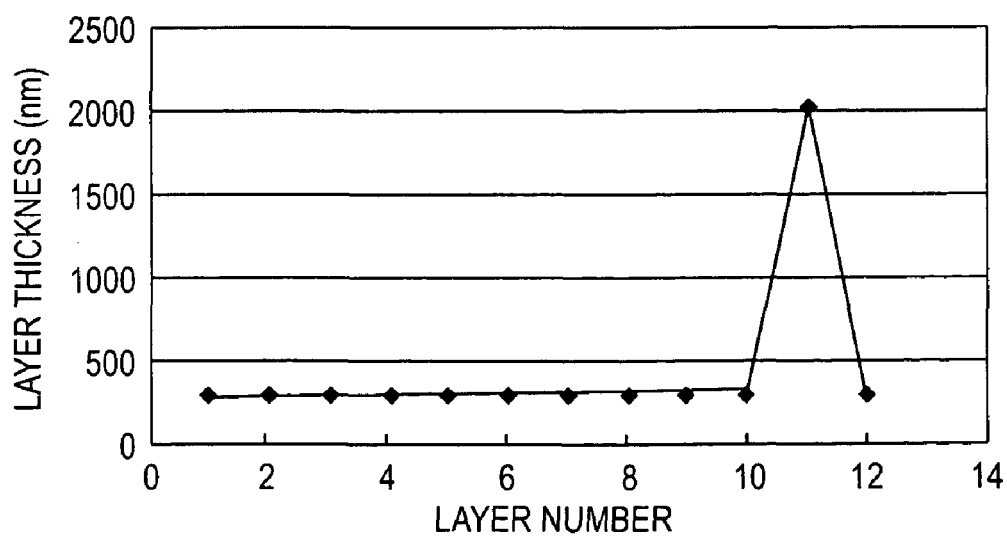
FIG. 34 is a graph showing a relationship between a layer number of a first semiconductor layer and a layer thickness in a fourteenth modified example.

FIG. 34 is a graph showing a relationship between a layer number of a first semiconductor layer and a layer thickness in an fourteenth modified example. As shown in FIG. 34, in the fourteenth modified example, the buffer layer includes twelve composite layers. The thickness of the first semiconductor layer is 2040 nm for a first semiconductor layer located at eleventh position as counted from the substrate. The other first semiconductor layers are 290 nm in thickness. The thickness of the buffer layer is 5.8 µm. Further, in the fourteenth modified example, the first semiconductor layers located at first, second, and eleventh positions as counted from the substrate have thicknesses greater than respective critical thicknesses. Accordingly, with the buffer layer according to the fourteenth modified example, the field effect transistor has a high breakdown voltage and small warp.

Fifteenth Modified Example

Figure 35:
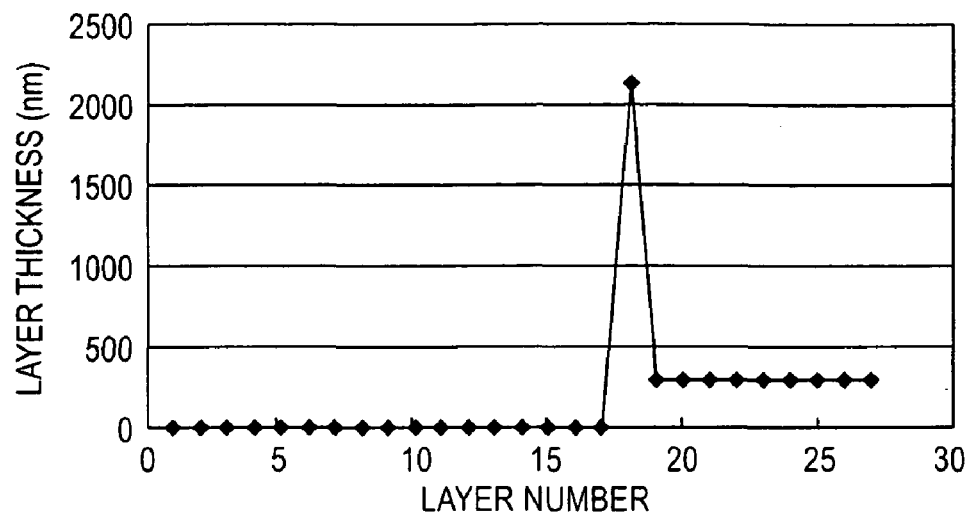
FIG. 35 is a graph showing a relationship between a layer number of a first semiconductor layer and a layer thickness in a fifteenth modified example.

FIG. 35 is a graph showing a relationship between a layer number of a first semiconductor layer and a layer thickness in an fifteenth modified example. As shown in FIG. 35, in the fifteenth modified example, the buffer layer includes twenty-seven composite layers. The thickness of the first semiconductor layer is 5 nm for first semiconductor layers located at first to seventeenth positions as counted from the substrate, 290 nm for first semiconductor layers located at nineteenth to twenty-seventh positions, and 2140 nm for first semiconductor layer located at eighteenth position. Further, the thickness of the second semiconductor layers is 5 nm for second semiconductor layers located at first to eighteenth positions as counted from the substrate, and 60 nm for second semiconductor layers located at nineteenth to twenty-seventh positions. The thickness of the buffer layer is 5.5 µm. Further, in the fifteenth modified example, the first semiconductor layer located at eighteenth position as counted from the substrate has a thickness greater than the critical thickness. Accordingly, with the buffer layer according to the fifteenth modified example, the field effect transistor has a high breakdown voltage and small warp.

Sixteenth Modified Example

Figure 36:
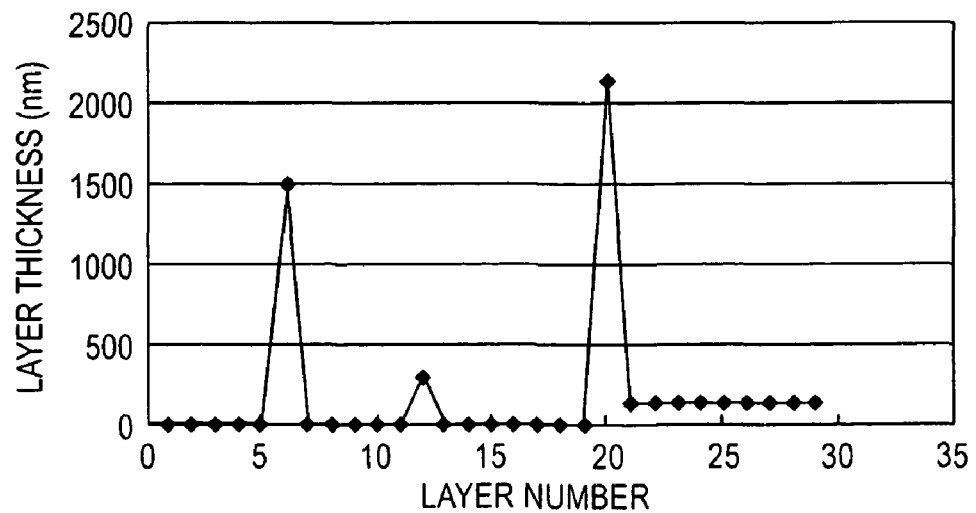
FIG. 36 is a graph showing a relationship between a layer number of a first semiconductor layer and a layer thickness in a sixteenth modified example.

FIG. 36 is a graph showing a relationship between a layer number of a first semiconductor layer and a layer thickness in an sixteenth modified example. As shown in FIG. 36, in the sixteenth modified example, the buffer layer includes twenty-nine composite layers. The thickness of the first semiconductor layers is 5 nm for first semiconductor layers located at first to fifth, seventh to eleventh, and thirteenth to nineteenth positions as counted from the substrate, 140 nm for first semiconductor layers located at twenty-first to twenty-ninth positions, 1495 nm for a first semiconductor layer located at sixth position, 295 nm for a first semiconductor layer located at twelfth position, and 2140 nm for a first semiconductor layer located at twentieth position. Further, the thickness of the second semiconductor layers is 5 nm for second semiconductor layers located at first to nineteenth positions as counted from the substrate, and 60 nm for second semiconductor layers located at twentieth to twenty-ninth positions. The thickness of the buffer layer is 5.97 µm. Further, in the sixteenth modified example, the first semiconductor layers located at sixth and twentieth positions as counted from the substrate have thicknesses greater than the respective critical thicknesses. Accordingly, with the buffer layer according to the sixteenth modified example, the field effect transistor has a high breakdown voltage and small warp.

In each of the above-described embodiments, a substrate formed of Si is used. However, a substrate formed of SiC or ZnO may be used instead. Further, a material for the intermediate layer, first and second semiconductor layer are not limited to those described as long as the material is a nitride-based compound semiconductor and the lattice constant and the thermal expansion coefficient have a predetermined relationship between those of the substrate.

Further, in each of the above-described embodiments, the semiconductor electronic device is a HEMT. However, the present invention is not limited to HEMTs but may be applied to various types of field effect transistors including insulation gate type (MIS type, MOS type) field effect transistor and Schottky gate type (MES type) field effect transistors etc.

Further, other than field effect transistors, the present invention may be applied to a variety of diodes including Schottky diode etc. For example, if the source electrode 51, the drain electrode 52, and the gate electrode 53 in the field effect transistor 100 according to the first embodiment are replaced with a cathode electrode and an anode electrode, a diode utilizing the present invention can be realized.

As described above, according to the present invention, it is possible to increase a number of composite layers in the buffer layer while restraining the warp of the epitaxial wafer. Accordingly, a semiconductor electronic device having a high breakdown voltage and small warp can be realized.

Although the invention has been described with respect to specific embodiments for complete and clear disclosure, the appended claims are not to be thus limited but are to be construed as embodying all modifications and alternative construction that may occur to one skilled in the art that fairly fall within the basic teaching herein set forth.

What is claimed is:

1. A semiconductor electronic device comprising:
a substrate;
a buffer layer formed on the substrate, the buffer layer including not less than two layers of composite layer in which a first semiconductor layer formed of a nitride-based compound semiconductor layer having a lattice constant smaller than a lattice constant of the substrate and a thermal expansion coefficient larger than a thermal expansion coefficient of the substrate and a second semiconductor layer formed of a nitride-based compound semiconductor having a lattice constant smaller than a lattice constant of the first semiconductor layer and a thermal expansion coefficient larger than a thermal expansion coefficient of the substrate are alternately laminated;
an intermediate layer provided between the substrate and the buffer layer, the intermediate layer being formed of a nitride-based compound semiconductor having a lattice constant smaller than a lattice constant of the first semiconductor layer and a thermal expansion coefficient larger than a thermal expansion coefficient of the substrate; and
a semiconductor active layer formed on the buffer layer, the semiconductor active layer being formed of a nitride-based compound semiconductor, wherein:
thicknesses of the first semiconductor layers in the buffer layer are non-uniform thereamong, and
at least one of the first semiconductor layer has a thickness greater than a critical thickness, the critical thickness being a thickness above which a direction of warp caused by the first semiconductor layer to the substrate is inverted.

2. The semiconductor electronic device according to claim 1, wherein the buffer layer is formed such that the thickness of the first semiconductor layers increases in a direction of lamination.

3. The semiconductor electronic device according to claim 1, wherein the buffer layer is formed such that the thickness of the first semiconductor layers decreases in a direction of lamination.

4. The semiconductor electronic device according to claim 1, wherein any one of the first semiconductor layers located at first to fourth positions as counted from the substrate is not less than 400 nm and not greater than 3000 nm in thickness, and is thicker than other first semiconductor layers.

5. The semiconductor electronic device according to claim 1, wherein the first semiconductor layer having a thickness greater than the critical thickness is located at a portion higher than two thirds of the number of the composite layers of the buffer layer.

6. The semiconductor electronic device according to claim 1, wherein the first semiconductor layer having a thickness greater than the critical thickness is located at a portion lower than one third of the number of the composite layers of the buffer layer.

7. The semiconductor electronic device according to claim 1, wherein the first semiconductor layer having a thickness greater than the critical thickness is located between one third and two thirds of the number of the composite layers of the buffer layer.

8. The semiconductor electronic device according to claim 1, wherein the first semiconductor layer having a thickness greater than the critical thickness is not less than 400 nm and not greater than 3000 nm in thickness.

9. The semiconductor electronic device according to claim 1, wherein the first semiconductor layer is formed of GaN and the second semiconductor layer is formed of $Al_xGa_{1-x}N$ ($0 < x \leq 1$).

10. The semiconductor electronic device according to claim 1, wherein the second semiconductor layers are not less than 0.5 nm and not greater than 200 nm in thickness.

11. The semiconductor electronic device according to claim 1, wherein the substrate is formed of any one of Si, SiC, and ZnO.

12. A semiconductor electronic device comprising:
a substrate;
a buffer layer formed on the substrate, the buffer layer including not less than two layers of composite layer in which a first semiconductor layer formed of a nitride-based compound semiconductor layer having a lattice constant smaller than a lattice constant of the substrate and a thermal expansion coefficient larger than a thermal expansion coefficient of the substrate and a second semiconductor layer formed of a nitride-based compound semiconductor having a lattice constant smaller than a lattice constant of the first semiconductor layer and a thermal expansion coefficient larger than a thermal expansion coefficient of the substrate are alternately laminated;
an intermediate layer provided between the substrate and the buffer layer, the intermediate layer being formed of a nitride-based compound semiconductor having a lattice constant smaller than a lattice constant of the first semiconductor layer and a thermal expansion coefficient larger than a thermal expansion coefficient of the substrate; and
a semiconductor active layer formed on the buffer layer, the semiconductor active layer being formed of a nitride-based compound semiconductor,
wherein the buffer layer is formed such that the thickness of the second semiconductor layers decreases in a direction of lamination.

13. A semiconductor electronic device comprising:
a substrate;
a buffer layer formed on the substrate, the buffer layer including not less than two layers of composite layer in which a first semiconductor layer formed of a nitride-based compound semiconductor layer having a lattice constant smaller than a lattice constant of the substrate and a thermal expansion coefficient larger than a thermal expansion coefficient of the substrate and a second semiconductor layer formed of a nitride-based compound semiconductor having a lattice constant smaller than a lattice constant of the first semiconductor layer and a thermal expansion coefficient larger than a thermal expansion coefficient of the substrate are alternately laminated;

an intermediate layer provided between the substrate and the buffer layer, the intermediate layer being formed of a nitride-based compound semiconductor having a lattice constant smaller than a lattice constant of the first semiconductor layer and a thermal expansion coefficient larger than a thermal expansion coefficient of the substrate; and a semiconductor active layer formed on the buffer layer, the semiconductor active layer being formed of a nitride-based compound semiconductor, wherein the buffer layer is formed such that the lattice constant of the second semiconductor layers increases in a direction of lamination.

14. The semiconductor electronic device according to claim 13, wherein each of the second semiconductor layers is formed of $Al_xGa_{1-x}N$ ($0 < x \leqq 1$), and the aluminum composition (x) decreases in a direction of lamination.

* * * * *